US010451676B2

United States Patent
Sonawane et al.

(10) Patent No.: US 10,451,676 B2
(45) Date of Patent: Oct. 22, 2019

(54) METHOD AND SYSTEM FOR DYNAMIC STANDARD TEST ACCESS (DSTA) FOR A LOGIC BLOCK REUSE

(71) Applicant: NVIDIA Corporation, Santa Clara, CA (US)

(72) Inventors: Milind Sonawane, San Jose, CA (US); Amit Sanghani, San Jose, CA (US); Shantanu Sarangi, Saratoga, CA (US); Jonathon E. Colburn, Ben Lomond, CA (US); Bala Tarun Nelapatla, Santa Clara, CA (US); Sailendra Chadalavda, Milpitas, CA (US); Rajendra Kumar Reddy.S, Bangalore (IN); Mahmut Yilmaz, Los Altos Hills, CA (US); Pavan Kumar Datla Jagannadha, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 15/336,736

(22) Filed: Oct. 27, 2016

(65) Prior Publication Data

US 2017/0115345 A1   Apr. 27, 2017

Related U.S. Application Data

(60) Provisional application No. 62/247,195, filed on Oct. 27, 2015, provisional application No. 62/285,429, filed on Oct. 27, 2015.

(51) Int. Cl.
*G01R 31/317* (2006.01)
*G01R 31/3177* (2006.01)
(Continued)

(52) U.S. Cl.
CPC ..... *G01R 31/3177* (2013.01); *G01R 31/2607* (2013.01); *G01R 31/2803* (2013.01);
(Continued)

(58) Field of Classification Search
CPC .... G01R 31/318555; G01R 31/318572; G01R 31/318541; G01R 31/318536;
(Continued)

(56) References Cited

U.S. PATENT DOCUMENTS 5,115,435 A * 5/1992 Langford, II .. G01R 31/318572
714/724
5,535,331 A    7/1996 Swoboda et al.
(Continued)

*Primary Examiner* — Albert Decady
*Assistant Examiner* — Enam Ahmed

(57) ABSTRACT

A method for testing. An external clock frequency is generated. Test data is supplied over a plurality of SSI connections clocked at the external clock frequency, wherein the test data is designed for testing a logic block. A DSTA module is configured for the logic block that is integrated within a chip to a bandwidth ratio, wherein the bandwidth ratio defines the plurality of SSI connections and a plurality of PSI connections of the chip. The external clock frequency is divided down using the bandwidth ratio to generate an internal clock frequency, wherein the bandwidth ratio defines the external clock frequency and the internal clock frequency. The test data is scanned over the plurality of PSI connections clocked at the internal clock frequency according to the bandwidth ratio, wherein the plurality of PSI connections is configured for inputting the test data to the plurality of scan chains.

20 Claims, 11 Drawing Sheets

(51) Int. Cl.
*G01R 31/26* (2014.01)
*G01R 31/28* (2006.01)
*G01R 31/3185* (2006.01)
*G06F 11/00* (2006.01)

(52) U.S. Cl.
CPC ..... *G01R 31/2806* (2013.01); *G01R 31/2834* (2013.01); *G01R 31/31701* (2013.01); *G01R 31/31707* (2013.01); *G01R 31/31724* (2013.01); *G01R 31/31725* (2013.01); *G01R 31/318555* (2013.01); *G01R 31/318572* (2013.01); *G06F 11/00* (2013.01)

(58) Field of Classification Search
CPC ............ G01R 31/3177; G01R 31/2607; G01R 31/2806; G01R 31/31725; G01R 31/31707; G01R 31/2803; G01R 31/31724; G01R 31/31701; G01R 31/2834; H05K 999/99; G06F 11/00
USPC ........................................................ 714/727
See application file for complete search history.

(56) References Cited

U.S. PATENT DOCUMENTS

| | | | |
|---|---|---|---|
| 5,805,608 A | 9/1998 | Baeg et al. | |
| 5,812,562 A | 9/1998 | Baeg | |
| 5,970,241 A | 10/1999 | Deao et al. | |
| 6,016,555 A | 1/2000 | Deao et al. | |
| 6,055,649 A | 4/2000 | Deao et al. | |
| 6,065,106 A | 5/2000 | Deao et al. | |
| 6,081,885 A | 6/2000 | Deao et al. | |
| 6,106,568 A | 8/2000 | Beausang et al. | |
| 6,112,298 A | 8/2000 | Deao et al. | |
| 6,163,583 A | 12/2000 | Lin et al. | |
| 6,192,092 B1 | 2/2001 | Dizon et al. | |
| 6,343,365 B1* | 1/2002 | Matsuzawa .... | G01R 31/318558 365/201 |
| 6,473,439 B1 | 10/2002 | Zerbe et al. | |
| 6,493,802 B1 | 12/2002 | Razdan et al. | |
| 6,586,921 B1 | 7/2003 | Sunter | |
| 6,622,255 B1 | 9/2003 | Kurd et al. | |
| 6,724,328 B1 | 4/2004 | Lui et al. | |
| 6,763,485 B2* | 7/2004 | Whetsel ......... | G01R 31/318536 714/726 |
| 6,785,856 B1 | 8/2004 | Parker et al. | |
| 6,813,739 B1 | 11/2004 | Grannis, III | |
| 6,949,958 B2 | 9/2005 | Zerbe et al. | |
| 7,015,741 B2 | 3/2006 | Tschanz et al. | |
| 7,046,174 B1 | 5/2006 | Lui et al. | |
| 7,093,150 B1 | 8/2006 | Norman et al. | |
| 7,245,684 B2 | 7/2007 | Adkisson | |
| 7,288,973 B2 | 10/2007 | Zerbe et al. | |
| 7,409,612 B2* | 8/2008 | Van De Logt .............................. | G01R 31/318541 324/750.3 |
| 7,447,961 B2 | 11/2008 | Tan | |
| 7,509,549 B2 | 3/2009 | Larson et al. | |
| 7,613,967 B1 | 11/2009 | Tan | |
| 7,831,856 B1 | 11/2010 | Liu et al. | |
| 7,984,369 B2 | 7/2011 | Sul et al. | |
| 7,987,401 B2 | 7/2011 | Pandey | |
| 8,112,654 B2 | 2/2012 | Bjerregaard | |
| 8,205,182 B1 | 6/2012 | Zlatanovici et al. | |
| 8,438,437 B2 | 5/2013 | Jain et al. | |
| 8,694,844 B2 | 4/2014 | Whetsel | |
| 8,887,117 B1 | 11/2014 | Chuang | |
| 9,103,879 B2 | 8/2015 | Douskey et al. | |
| 9,116,205 B2 | 8/2015 | Douskey et al. | |
| 9,437,328 B2 | 9/2016 | Yang | |
| 9,459,651 B2 | 10/2016 | Moheban et al. | |
| 9,529,044 B1 | 12/2016 | Taneja et al. | |
| 9,733,308 B2 | 8/2017 | Whetsel | |
| 10,281,524 B2 | 5/2019 | Chadalavda et al. | |
| 10,317,463 B2 | 6/2019 | Sonawane et al. | |
| 2002/0162063 A1 | 10/2002 | Whetsel | |
| 2002/0196886 A1 | 12/2002 | Adkisson | |
| 2002/0199124 A1 | 12/2002 | Adkisson | |
| 2003/0053489 A1 | 3/2003 | Zerbe et al. | |
| 2003/0229834 A1 | 12/2003 | Cooke | |
| 2004/0190665 A1 | 9/2004 | Uratani et al. | |
| 2004/0194109 A1 | 9/2004 | Boros et al. | |
| 2005/0024074 A1* | 2/2005 | Benjamin ...... | G01R 31/318357 716/112 |
| 2005/0055617 A1 | 3/2005 | Wang | |
| 2005/0102643 A1 | 5/2005 | Hou et al. | |
| 2005/0209805 A1* | 9/2005 | Chang ............ | G01R 31/318552 702/79 |
| 2005/0234674 A1 | 10/2005 | Bundy et al. | |
| 2005/0242836 A1 | 11/2005 | Goetting et al. | |
| 2005/0262492 A1 | 11/2005 | Goetting et al. | |
| 2006/0022724 A1 | 2/2006 | Zerbe et al. | |
| 2006/0026473 A1 | 2/2006 | Patrick Tan | |
| 2006/0095818 A1 | 5/2006 | Bratt et al. | |
| 2006/0149987 A1 | 7/2006 | Klowden et al. | |
| 2007/0106923 A1 | 5/2007 | Aitken et al. | |
| 2007/0300001 A1 | 12/2007 | Dirscherl et al. | |
| 2008/0008015 A1 | 1/2008 | Darbinyan et al. | |
| 2008/0034334 A1 | 2/2008 | Laouamri | |
| 2008/0046770 A1 | 2/2008 | Jong et al. | |
| 2008/0276116 A1 | 11/2008 | Bjerregaard | |
| 2009/0150709 A1 | 6/2009 | Arnold et al. | |
| 2009/0183040 A1* | 7/2009 | Whetsel ......... | G01R 31/318555 714/727 |
| 2009/0184735 A1 | 7/2009 | Wicki et al. | |
| 2010/0223519 A1 | 9/2010 | Swoboda | |
| 2010/0235698 A1 | 9/2010 | Diewald et al. | |
| 2011/0099442 A1 | 4/2011 | Hales et al. | |
| 2011/0221469 A1 | 9/2011 | Schlagenhaft | |
| 2012/0117436 A1 | 5/2012 | Portolan et al. | |
| 2012/0146535 A1 | 6/2012 | Lee et al. | |
| 2012/0159276 A1* | 6/2012 | Zandian ............ | G01R 31/3016 714/734 |
| 2013/0159800 A1* | 6/2013 | Ravi ................... | G01R 31/3177 714/727 |
| 2013/0194016 A1 | 8/2013 | Wimer | |
| 2014/0089750 A1 | 3/2014 | Douskey et al. | |
| 2014/0157067 A1 | 6/2014 | Yang | |
| 2014/0247080 A1 | 9/2014 | Moheban et al. | |
| 2014/0292385 A1 | 10/2014 | Bahl et al. | |
| 2014/0298125 A1 | 10/2014 | Devadze et al. | |
| 2015/0046763 A1 | 2/2015 | Makar et al. | |
| 2015/0178102 A1 | 6/2015 | Regner et al. | |
| 2015/0220470 A1 | 8/2015 | Chen et al. | |
| 2015/0229469 A1 | 8/2015 | Hainz | |
| 2016/0070619 A1 | 3/2016 | Moran et al. | |
| 2017/0115338 A1 | 4/2017 | Chadalavda | |
| 2017/0115346 A1 | 4/2017 | Sonawane | |
| 2017/0115351 A1 | 4/2017 | Datla Jagannadha et al. | |
| 2017/0115352 A1 | 4/2017 | Jayaraman et al. | |
| 2017/0115353 A1 | 4/2017 | Sonawane | |
| 2017/0133070 A1 | 5/2017 | Ware et al. | |
| 2017/0195754 A1 | 7/2017 | Grambichler et al. | |
| 2017/0205465 A1 | 7/2017 | Sarangi | |
| 2017/0269145 A1 | 9/2017 | Whetsel | |
| 2018/0122444 A1 | 5/2018 | Ware et al. | |

* cited by examiner

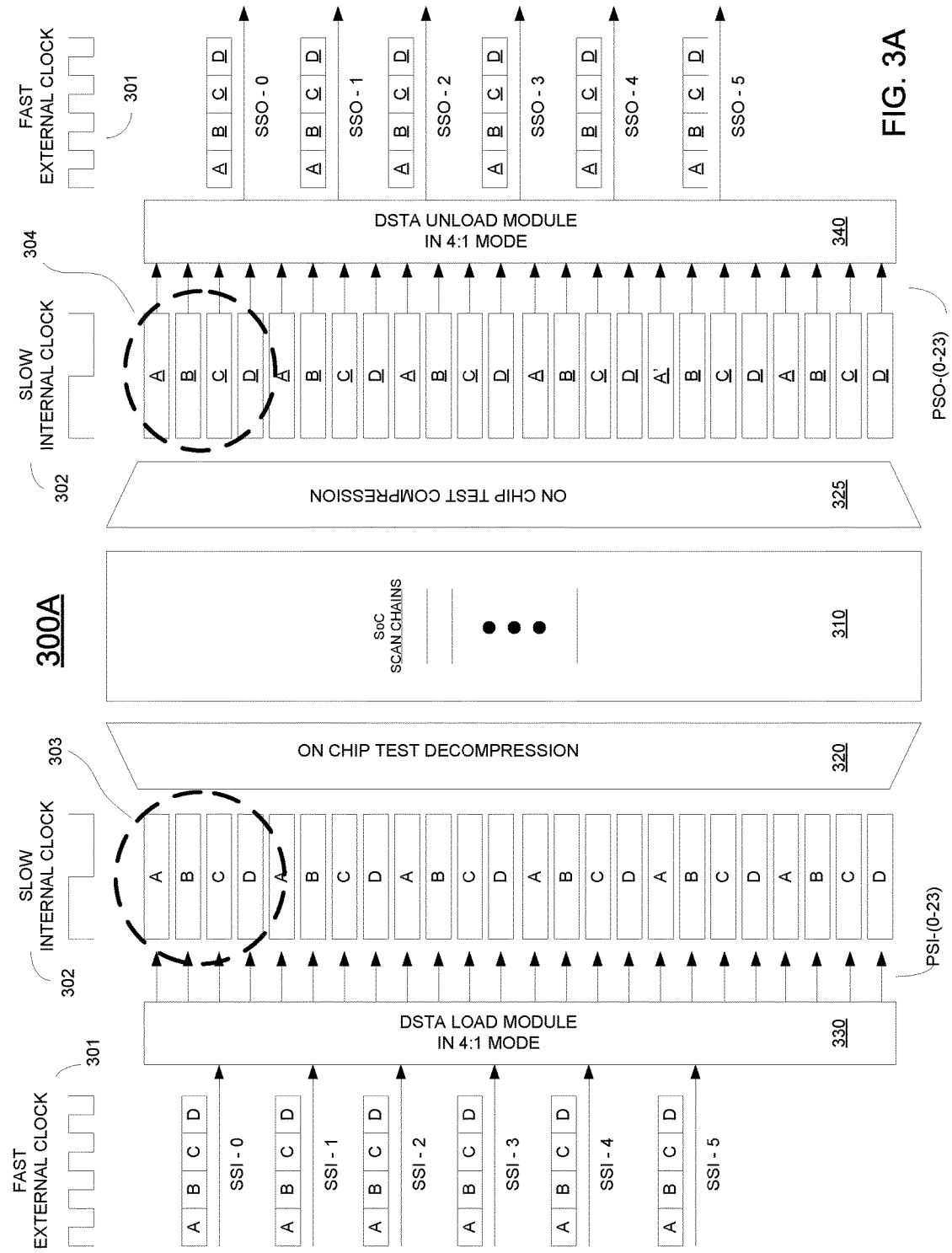

METHOD AND SYSTEM FOR DYNAMIC STANDARD TEST ACCESS (DSTA) FOR A LOGIC BLOCK REUSE

CROSS-REFERENCE TO RELATED APPLICATIONS

This application claims priority to and the benefit of following applications:

U.S. Provisional Application Ser. No. 62/247,195, filed on Oct. 27, 2015, entitled "SCANS SYSTEMS AND METHODS"; and U.S. Provisional Application Ser. No. 62/285,429, filed on Oct. 27, 2015, entitled "SCANS SYSTEMS AND METHODS"; which are all hereby incorporated by reference in their entirety for all intents and purposes.

BACKGROUND

Chips including semiconductor integrated circuits undergo a variety of tests to determine whether the semiconductor devices are operating properly. For instance, scan based tests of the circuits may be performed by an automatic test equipment (ATE) configured to test one or more similarly configured chips in parallel. Scan based tests of circuits on a chip include "scan shift" and "scan capture" operations. These scan based tests can operate on a scan chain of connected registers (e.g., flip-flops or latches) that are designed for testing by inputting data and analyzing the output data from each of the scan chains.

In some cases, an ATE is configurable to input data used for testing chips at speeds from 250 MHz to 500 MHz, and in some cases even up to 1600 MHz. On the other hand, scan chains designed for test may only be able to shift in the data into the registers at much lower frequencies (e.g., ranging from 10 MHz to 100 MHz) due to chip timing and power constraints in test mode. In order to reduce scan pin requirements, bandwidth matching between the high speed scan data from the ATE and the internal scan chains may be performed by a load deserializer and an unload deserializer.

One of the problems encountered with a chip designed for testing is that a fixed bandwidth ratio limits optimization during testing. Specifically, a scan architecture of a chip may have a fixed bandwidth ratio (e.g., 4-to-1) between external scan data (from/to ATE) and internal scan chain data. Design modules located within the chip are designed to perform testing in compliance with the bandwidth ratio. However, this restricts the chip to also have a fixed bandwidth ratio, and a fixed number of scan pin requirements for all design modules in a chip. Because the external scan data rate and the internal data rate must remain fixed, a scan shift operation cannot be altered to run at desired speeds based on timing signoff, and the channel bandwidth cannot be optimized.

Another problem encountered with a chip designed for testing is that design modules are not reuse friendly. That is, a design module used in an original chip cannot be incorporated into a new chip configured with fewer available pins for testing. Further, even if the design module was incorporated into the new chip, the test patterns designed for the original chip are unusable in the new chip because of the different number of scan pins for test. In this case, for design module reuse, either additional scan pins for test must be allocated at the chip level to accommodate for different numbers of scan pins required for testing for different chips, or the design module incorporated into the new chip must be redesigned to accommodate its required number of scan pins for test. This inflexible design allows for reduction in scan pin counts and an efficient utilization of tester resources, but does not provide flexibility in cases where a design module is reused, or where a scan data bandwidth is changed.

Still another problem encountered with a chip designed for testing is that the scan data rate is fixed. Normally, the ATE channel bandwidth is fully utilized for a chip having one or more internal design modules designed for that chip. However, the ATE channel data rate or scan data rate cannot be adjusted because the internal scan chain data rate (used for loading data into the registers of the scan chain) is limited and/or fixed due to timing and power constraints.

As a previously introduced solution to the above described problems, the timing signoff of the internal scan chain shift speed can be adjusted to a higher speed. However, because this feature requires additional gate area and interconnect resources for test related paths, adjusting the internal scan chain shift speed higher is not feasible as the cost of the chip would increase. Also, if scan chains are shifted at the higher speeds, there may be a peak power issue on the ATE that needs to be addressed.

SUMMARY

It is desirable to have a chip design capable of reusing a design module while retaining original testing abilities of the reused design module.

In embodiments of the present invention, a method for testing chips with flexible bandwidth ratios between an external scan data rate and an internal scan chain data rate to accommodate different chips having the same logic block. The method includes generating a first external clock frequency. The method includes supplying test data over a first plurality of serial scan input (SSI) connections clocked at the first external clock frequency, wherein the test data is designed for testing a logic block when input to a plurality of scan chains of the logic block. The method includes configuring a Dynamic Standard Test Access (DSTA) module for the logic block that is integrated within a first chip to a first bandwidth ratio, wherein the first bandwidth ratio defines the first plurality of SSI connections and a first plurality of pseudo scan input (PSI) connections of the first chip. The method includes dividing the first external clock frequency down using the first bandwidth ratio to generate a first internal clock frequency, wherein the first bandwidth ratio also defines the first external clock frequency and the first internal clock frequency. The method includes scanning the test data over the first plurality of PSI connections clocked at the first internal clock frequency according to the first bandwidth ratio, wherein the first plurality of PSI connections is configured for inputting the test data to the plurality of scan chains.

In another embodiment, a computer system is described, wherein the computer system includes a processor, and memory coupled to the processor and having stored therein instructions that, if executed by the computer system, cause the computer system to execute a method for testing. The method includes generating a first external clock frequency. The method includes supplying test data over a first plurality of SSI connections clocked at the first external clock frequency, wherein the test data is designed for testing a logic block when input to a plurality of scan chains of the logic block. The method includes configuring a DSTA module for the logic block that is integrated within a first chip to a first bandwidth ratio, wherein the first bandwidth ratio defines the first plurality of SSI connections and a first plurality of PSI connections of the first chip. The method includes dividing the first external clock frequency down using the first bandwidth ratio to generate a first internal clock frequency, wherein the first bandwidth ratio also defines the first external clock frequency and the first internal clock frequency. The method includes scanning the test data over the first plurality of PSI connections clocked at the first internal clock frequency according to the first bandwidth ratio, wherein the first plurality of PSI connections is configured for inputting the test data to the plurality of scan chains.

In still another embodiment, an apparatus configured for testing chips, wherein the apparatus is capable of testing with flexible bandwidth ratios between an external scan data rate and an internal scan chain data rate to accommodate different chips having the same logic block. The apparatus includes an external clock for generating a first external clock frequency. The apparatus includes a first plurality of SSI connections of an ATE configured for supplying test data clocked at the first external clock frequency, wherein the test data is designed for testing a logic block when input to a plurality of scan chains of the logic block. The method includes a DSTA module for the logic block that is integrated within a first chip, wherein the DSTA module is configured to a first bandwidth ratio, wherein the first bandwidth ratio defines the first plurality of SSI connections and a first plurality of PSI connections. The apparatus includes a clock divider configured for dividing the first external clock frequency down using the first bandwidth ratio to generate a first internal clock frequency, wherein the first bandwidth ratio also defines the first external clock frequency and the first internal clock frequency. The apparatus also includes a serializer for scanning the test data over the first plurality of PSI connections clocked at the first internal clock frequency according to the first bandwidth ratio, wherein the first plurality of PSI connections is configured for inputting the test data to the plurality of scan chains.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIGS. 3A-E are block diagrams illustrating the implementation of DSTA modules for a logic block design integrated within five different SoC configurations, wherein the DSTA module is configured to implement flexible bandwidth ratios for test pattern reuse such that each SoC configuration is accessed using a corresponding bandwidth ratio, in accordance with embodiments of the present disclosure.

DETAILED DESCRIPTION OF THE INVENTION

Figure 1A:
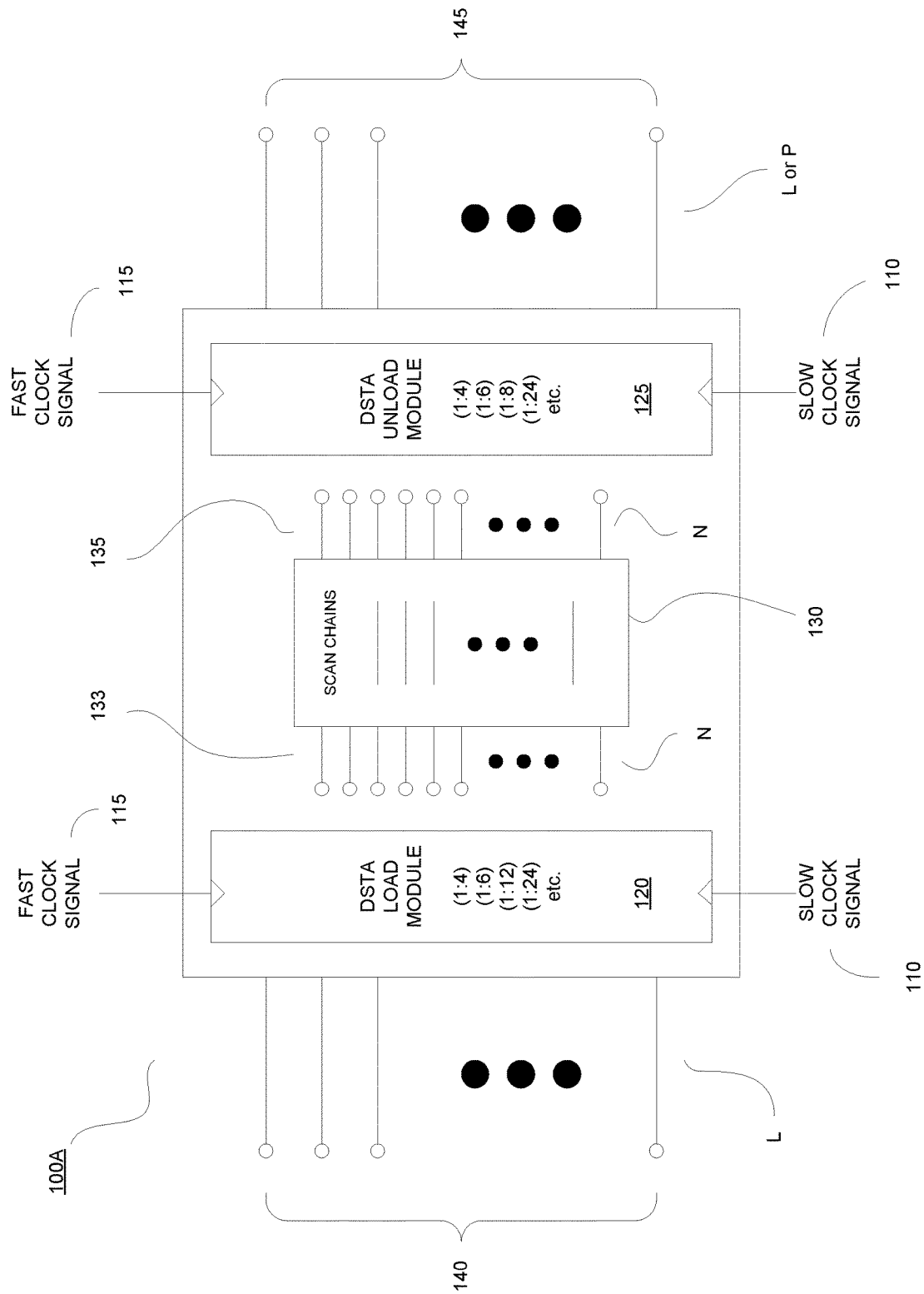
FIG. 1A is a block diagram illustrating a Dynamic Standard Test Access (DSTA) module for a logic block integrated within a system on a chip (SoC), wherein the DSTA module is configured to implement flexible bandwidth ratios for test pattern reuse of the logic block, in accordance with one embodiment of the present disclosure.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present invention provide for a DSTA module incorporated into a logic block, or SoC including the logic block, for testing the logic block, wherein the DSTA module is configured to implement flexible bandwidth ratios for test pattern reuse of a logic block incorporated into one or more SoC platforms. Embodiments of the present invention provide for scan architectures in logic blocks and/or SoC platforms that allow for varying the external scan data rate while keeping the internal scan data rate fixed, or vice versa keeping the external scan data rate fixed while changing the internal scan data rate in order to optimize the utilization of channel bandwidth, or to run the scan shift at desired speeds based on a timing signoff. In addition, embodiments of the present invention allow logic blocks to be incorporated in multiple SoC platforms, such that a logic block may be used within a new SoC that has fewer or more available connections for test, without having to allocate additional scan connections at the SoC, or without having to redesign the logic block. Further, embodiments of the present invention provide for the ability to vary the external scan data rate and/or internal scan data rate in order to fully utilize the ATE channel bandwidth.

Embodiments of the present invention can be implemented as a hardware or software solution, or a combination of the two. For instance, a DSTA Load or Unload module having configurable bandwidth ratios can be implemented in hardware using, in part, one or more flip flops. In another embodiment, the DSTA Load or Unload module having configurable bandwidth ratios can be implemented as a software solution.

Throughout this application, the term "SoC" may be analogous to the term "chip," both defining an integrated circuit implemented on a single chip substrate. It may contain components of a computing system or other electronic system. In addition, the term "logic block" defines a specialized circuit design that performs one or more specific functions. The logic block may be integrated, in part, with other logic blocks to form an SoC. In addition, the term "logic block" may be analogous to the term "chiplet" or "design module."

Figure 2:
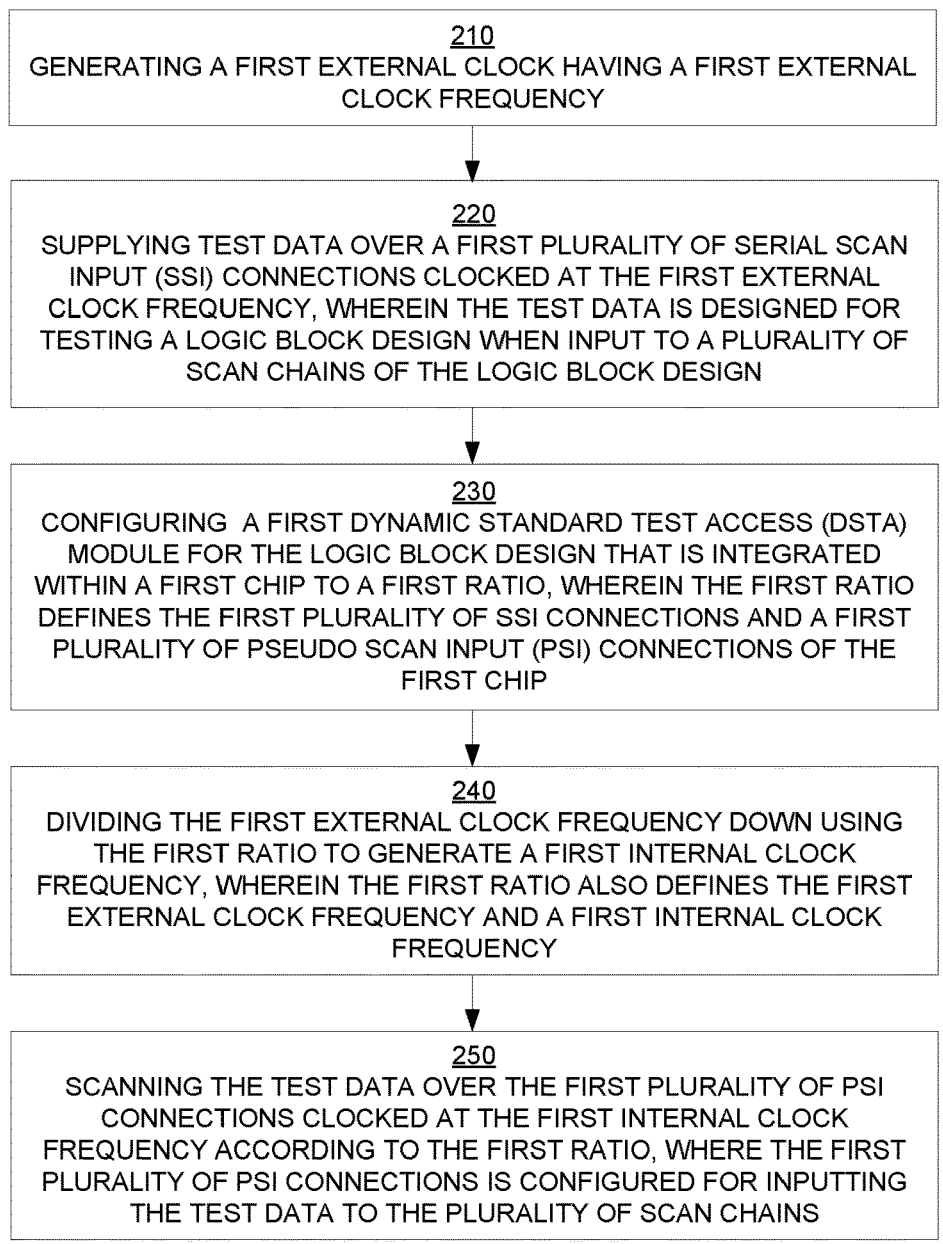
FIG. 2 is a flow diagram illustrating a method for test pattern reuse for a logic block as integrated within different SoC platforms, wherein the logic block includes a DSTA module configured to implement flexible bandwidth ratios for test pattern reuse, in accordance with one embodiment of the present disclosure.

FIG. 2 is a flowchart of a computer-implemented method for the dynamic configuration of DSTA modules associated with a logic block to implement flexible bandwidth ratios for test pattern reuse of the logic block, according to embodiments of the present invention. Although specific steps are disclosed in the flowcharts, such steps are exemplary. That is, embodiments of the present invention are well-suited to performing various other steps or variations of the steps recited in the flowcharts.

FIG. 1A is a block diagram illustrating a DSTA module for a logic block, wherein the DSTA module is configured to implement flexible bandwidth ratios for test pattern reuse of the logic block, in accordance with one embodiment of the present disclosure. In particular, because of the capability of the DSTA module to adjust the external scan data rate and the internal data rate, different bandwidth ratios can be supported for various SoC platforms having the same logic block. This provides for flexibility of adjusting bandwidth ratios during testing of one or more SoC platforms, each having the same logic block. Because the various SoC platforms are capable of being tested by adjusting the bandwidth ratios to support the internal data rate of the logic block, a costly redesign of the logic block is avoided when incorporating the logic block within a new SoC having a different bandwidth ratio than the source SoC for which the logic block was originally designed.

In another embodiment, the DSTA load module 120 and DSTA unload module 125 are integrated at the SoC level, instead of at the logic block level. That is, the SoC at the edge of the device includes the DSTA load and unload modules in anticipation of reusing the above referenced logic block and/or other logic blocks, wherein the SoC may be accessed using different numbers of test access pin counts than was originally anticipated when designing the logic block.

As shown, the logic block 100A includes a plurality of input connections 140 used for test access. For example, the plurality may include "L" input connections. The input connections 140 may be configured as serial scan input (SSI) connections. The SSI connections 140 may be configured for receiving test data used to determine whether the components in the SoC 100A are operating properly. Each of the SSI connections 140 may be dedicated for testing, or may be configured to both serve as a test input and/or to serve some functional purpose other than for testing. For example, during testing an ATE may be delivering test data to the logic block 100A through one or more of the SSI connections 140. The test data may be introduced by the ATE to input connections at the edge of the SoC and internally routed to the SSI connections 140, or may be directly inputted by the ATE to the SSI connections 140. The test data is clocked over the SSI connections 140 using the fast clock signal 115. The fast clock signal 115 is generated from an external clock, such as a clock supplied by the ATE. That is, the ATE may deliver test data using at high clocking frequencies to reduce the amount of time the SoC 100A is undergoing testing.

Further, the logic block 100A includes a plurality of output connections 145. For example, the plurality may include "N" output connections. The output connections 145 may be configured as serial scan output (SSO) connections. The SSO connections 145 may be configured for delivering results from testing the logic block 100A back to the ATE, either directly or as internally routed through an SoC. Each of the SSO connections 145 may be dedicated for testing, and more specifically for delivering test results, or may be configured to both serve as a test output and/or to serve some functional purpose other than for testing. For example, during testing an ATE may be receiving test results from the logic block 100A through one or more of the SSO connections 145. The results may be clocked over the SSO connections 145 again using the fast clock signal 115.

A DSTA load module 120 is coupled to the plurality of SSI connections 140, and is configured to receive the test data. The DSTA load module 120 is configured to deserialize the test data received from the ATE over the SSI connections 140 using a fast clock but narrow width of channels. Specifically, the DSTA load module 120 slows down the delivery of the test data using the slow clock signal 110 in accordance with a bandwidth (BW) ratio that is configurable. The slow clock signal 110 is derived from the fast clock signal 115 (e.g., generated using a clock divider). More particularly, the bandwidth ratio, in part, defines the frequency of the fast clock 115 and the frequency of the slow clock 110. For example, the bandwidth ratio is defined by the following equation:

$$BW \text{ ratio} = (\text{frequency of fast clock})/(\text{frequency of slow clock}). \quad (1)$$

Figure 1B:
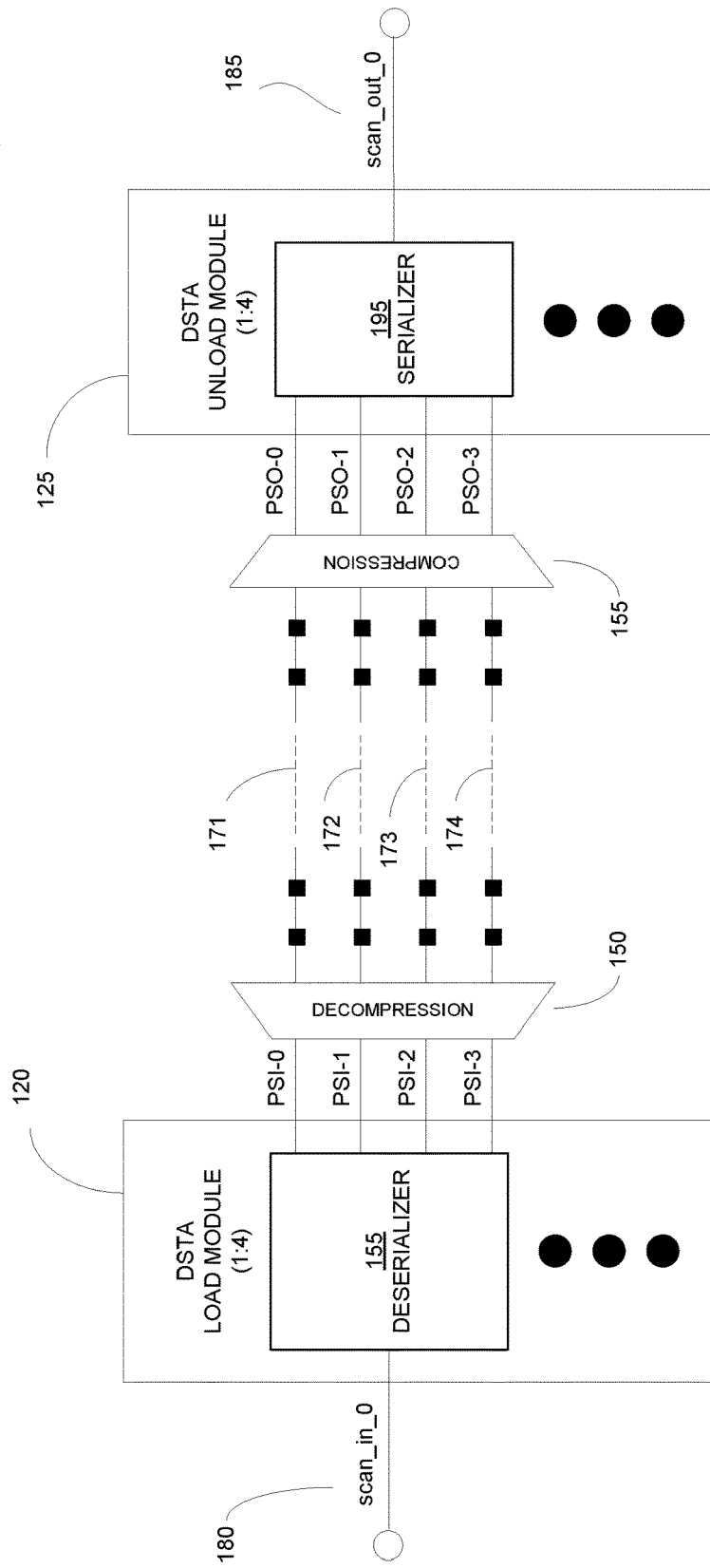
FIG. 1B is a block diagram illustrating load and unload DSTA modules implementing a particular bandwidth ratio, in accordance with one embodiment of the present disclosure.

In addition, when deserializing the test data, the DSTA load module 120 spreads the test data across a plurality of channels also in accordance with the bandwidth ratio, as will be further described in relation to FIG. 1B. In particular, the test data is spread over a wider number of channels than those associated with the SSI connections 140, but a slower speed. For example, the test data from one SSI connection that is clocked at a fast frequency of the fast clock signal 115 may be spread to multiple pseudo scan input (PSI) connections 133 clocked at the slow frequency of the slow clock signal 110, in one embodiment. In another embodiment, the test data from one or more SSI connections clocked using the fast clock signal 115 may be spread to multiple PSI connections 133 clocked using the slow clock signal 110 in accordance with the bandwidth ratio. In that case, the bandwidth ratio is also defined by the following equation:

$$BW \text{ ratio} = (\text{number of PSI connections})/(\text{number of SSI connections}). \quad (2)$$

As shown, the plurality of channels internal to the logic block 100A is defined by a plurality of scan chains 130. The channels are also defined by plurality of inputs to scan chains (PSI connections 133) and a plurality of outputs to the scan chains (pseudo scan output (PSO) connections 135). Typically, each scan chain is associated with one PSI and one PSO. The scan chain includes state logic (e.g., flip-flops, latches, etc.) coupled together (e.g., in sequence) by a shift register. For example, the shift register may define a cascade of flip-flops, wherein the output of one flip-flop is coupled to the input of the next flip-flop in the cascade.

As shown in FIG. 1A, a DSTA unload module 125 is coupled to the plurality of PSO connections 135. The DSTA unload module 125 is configured to deliver test results from the plurality of scan chains 130 over the plurality of SSO connections 145. In particular, the DSTA unload module 120 is configured to serialize the test results for delivery to the ATE through the SSO connections 145, either directly to the ATE or routed internally through an SoC. Specifically, the DSTA unload module 125 receives the test results from the outputs of the scan chains over the PSO connections 135 that are clocked using the slow clock signal 110. During serialization, the DSTA unload module 125 speeds up the delivery of the test results over the SSO connections 145 using the fast clock signal 115 in accordance with a bandwidth ratio that is configurable, in one embodiment.

In addition, when serializing the test results, the DSTA unload module 125 consolidates test results received across lanes of scan chains down to a fewer number of SSO connections 145. In one embodiment, the consolidation of test results from the lanes to the SSO connections 145 is performed in accordance with the bandwidth ratio, as will be further described in relation to FIG. 1B. For example, the test results from multiple scan chains clocked using the slow clock signal 110 is consolidated for delivery over one or more SSO connections, in accordance with the bandwidth ratio, that are clocked using the fast clock signal 115. In another embodiment, the consolidation of test results from the lanes to the SSO connections is not performed in accordance with the bandwidth ratio. For example, the test results may include a minimum of data, and can be delivered using a reduced number of SSO connections not in accordance with the bandwidth ratio, such as a single SSO connection.

DSTA used in scan architectures for testing of embodiments of the present invention, with and without test compression, are flexible and can support various clock frequency configurations (e.g., bandwidth ratios). With the flexibility, the logic blocks can be used in one or more SoC platforms, in order to be used for varying, low pin count test modes. This DSTA load module 120 allows flexible bandwidth ratios while keeping the interface standard to be able to reuse the test patterns originally generated for a particular logic block. In that manner, a logic block originally designed for a source SoC and successfully tested may be reused in other derivative SoC platforms. The logic block may be reused even when the derivative SoC has a different number of test input/output connections available in the packet. For instance, the derivative SoC may be a lower number of connections available for testing based on the addressed or targeted markets. Embodiments of the present invention provide for logic block reuse in the derivative SoC with a lesser number of test connections assigned while maintaining the same test patterns for testing the logic block in the derivative SoC.

As such, the DSTA load module 120 and DSTA unload module 125 can support various bandwidth ratios. For illustration, the DSTA modules can be configured in 24-to-1 12-to-1, 8-to-1, 6-to-1, and 4-to-1 bandwidth ratios. As an example, for an 8-to-1 bandwidth ratio, each SSI of the DSTA load module 120 can drive up to eight PSIs each operating eight times slower. The DSTA module design of embodiments of the present invention is not limited to these ratios described for illustration, and can be extended to any ratio. In one embodiment, the DSTA load module 120 and DSTA unload module 125 are local to the logic block. In another embodiment, the DSTA load module 120 and DSTA unload module 125 is local to the SoC and internally routed from the edge of the SoC to the logic block of interest.

FIG. 1B is a block diagram illustrating load and unload DSTA modules of a logic block 100B implementing a particular bandwidth ratio, in accordance with one embodiment of the present disclosure. FIG. 1B is an illustration of one implementation of the logic block 100A of FIG. 1A, wherein the DSTA load module 120 and DSTA unload module 125 of FIG. 1B are configured having a 4-to-1 bandwidth ratio. Other configurations of the DSTA modules allow for differently configured bandwidth ratios supporting the particular logic block.

In particular, the scan_in_0 signal over the SSI input channel 180 is delivered to the DSTA load module 120 using a fast clock signal from an external clock (not shown). For example, the scan_in_0 signal is delivered to the deserializer 155 of the DSTA load module 120, wherein the deserializer 155 is configured to divide the fast clock signal down to a slow clock signal, and spread the test data across multiple PSI input lanes, in accordance with the 4-to-1 bandwidth ratio. For a 4-to-1 bandwidth ratio, the test data inputted from the scan_in_0 signal is spread across four PSI lanes (e.g., PSI-0, PSI-1, PSI-2, and PSI-3), in accordance with the bandwidth ratio. More particularly, the test data across four clock cycles of the fast clock are spread across the four PSI lanes, wherein test data in one of the four clock cycles of the fast clock is delivered to a corresponding PSI lane for delivery to a scan chain over a single clock cycle of the slow clock. As shown, the test data received by PSI-0 is delivered to scan chain 171 after decompression, test data received by PSI-1 is delivered to scan chain 172, test data received by PSI-2 is delivered to scan chain 173, and test data received by PSI-3 is delivered to scan chain 174. The deserialization of test data is further described in relation to FIGS. 3A-E.

The test data may be delivered from the ATE in compressed form. The number of total scan chains, and length of longest chain in scan based design are determined by total number of flops and available number of scan inputs/outputs of the SoC platforms or logic blocks and test channels available on an ATE. Test time reduction can be achieved through test data compression, which reduces the test data volume to be stored on ATE. This is done by driving test stimuli from ATE to multiple internal short chains using on-chip decompression logic and compacting the responses from these internal multiple short chains using on-chip compression logic. With this compression technique, a small number of ATE channels can drive a larger number of shorter internal scan chains, and the depth of each ATE channel is minimized, which can reduce ATE test time significantly.

As a result, the test data over each of the PSI lanes (e.g., PSI-0 through PSI-3) is decompressed before delivery to corresponding scan chains 171-174 using decompression module 150. Also, after testing, the test results are compressed again for the fastest delivery back to the ATE through the DSTA unload module 125 in accordance with the bandwidth ratio. As shown, test results from scan chain 171 is compressed using compression module 155 and delivered over PSO-0 to the serializer 195, test results from scan chain 172 is compressed and delivered over PSO-1 to the serializer 195, test results from scan chain 173 is compressed and delivered over PSO-2 to the serializer 195, and test results from scan chain 174 is compressed and delivered over PSO-3 to the serializer 195.

The serializer 195 is configured to receive test results over the PSO lanes that are clocked using the slow clock, and consolidate the test results for delivery in the single scan_out_0 output signal over the SSO output 185 channel. That is, test results from the scan chains 171-174 are consolidated and delivered over the SSO output 185, in accordance with the bandwidth ratio. For a 4-to-1 bandwidth ratio, the test results received over PSO lanes (e.g., PSO-0, PSO-1, PSO_2, and PSO-3) over one clock cycle of the slow clock signal is collected and delivered as an scan-out-0 signal in the output channel 185 over four clock cycles of a fast clock signal. The serialization of test results is further described in relation to FIGS. 3A-E.

In particular, the SSI input (e.g., scan_in_0) is delivered to the DSTA load module 120 using a fast clock signal from an external clock (not shown). For example, scan_in_0 is delivered to the deserializer 155 of the DSTA load module 120, wherein the deserializer 155 is configured to divide the fast clock signal down to a slow clock signal, and spread the test data across multiple PSI input lanes, in accordance with the 4-to-1 bandwidth ratio. For a 4-to-1 bandwidth ratio, the test data inputted from the scan_in_0input is spread across four PSI lanes (e.g., PSI-0, PSI-1, PSI-2, and PSI-3), in accordance with the bandwidth ratio. More particularly, the test data across four clock cycles of the fast clock are spread across the four PSI lanes, wherein test data in one of the four clock cycles of the fast clock is delivered to a corresponding PSI lane for delivery to a scan chain over a single clock cycle of the slow clock. As shown, the test data received by PSI-0 is delivered to scan chain 171 after decompression, test data received by PSI-1 is delivered to scan chain 172, test data received by PSI-2 is delivered to scan chain 173, and test data received by PSI-3 is delivered to scan chain 174. The serialization of test data is further described in relation to FIGS. 3A-E.

FIG. 2 is a flow diagram 200 illustrating a method for test pattern reuse for a logic block as integrated within different SoC platforms, wherein the corresponding logic block and/or SoC includes a DSTA module configured to implement flexible bandwidth ratios for test pattern reuse of the logic block, in accordance with embodiments of the present disclosure. In particular, FIG. 2 is a flow diagram 200 illustrating a method for configuring bandwidth ratios between external scan data (from/to ATE) and an internal scan chain data associated with a particular logic block. In this manner, embodiments of the present invention match the data bandwidth between high speed scan data from the ATE and internal scan chains of the logic block. As a benefit, scan pin requirements are reduced to a minimum, and the available channel bandwidth (e.g., speeds of up to 1600 MHz carrying data over an optimum number of channels) carrying ATE test data may be fully utilized. The method outlined in flow diagram 200 is implementable by one or more components of the logic blocks 100A-B of FIGS. 1A-B, or one or more components of a SoC in various embodiments of the present invention.

In that manner, the method of flow diagram 200 allows for a designed test pattern for a particular logic block to be reused in different, derivative SoC platforms that also incorporate that logic block. As such, even though a derivative chip may have a different (e.g., lower) number of access connections available in the package (e.g., SoC) and assigned to that logic block, based on the addressed markets to which the derivate chip is targeted, the test pattern may still be delivered over the access connections by configuring the bandwidth ratio to match the data bandwidth between the high speed external scan data (e.g., from the ATE) and the internal scan chain data of the logic block. By configuring the bandwidth ratio properly, the available channel bandwidth assigned to the ATE may be fully utilized, and the number of scan pin requirements may be reduced to a minimum.

At 210, the method includes generating a first external clock frequency. For example, an external clock may generate the first external clock frequency. In one embodiment, the external clock may be generated by an ATE that is used for testing the logic block that is integrated into various SoC platforms.

At 220, the method includes supplying test data over a first plurality of SSI connections clocked at the first external clock frequency. The test data is designed for testing a particular logic block, and may be generated through an automatic test pattern generation tool. The test data may be driven by an ATE when testing the logic block. For example, the test data may be input to a plurality of scan chains of the logic block and subsequently read out from the scan chains to determine whether there are errors within the components of the scan chain.

In general, test data is delivered to the internal circuits of a device (e.g., SoC and/or logic block of an SoC), wherein state logic (e.g., flip-flops, latches, etc.) are connected together in a plurality of scan chains. For example, a long shift register connects the flip-flops in a corresponding scan chain. The scan chains are used to access the internal nodes of the circuit. The test data is shifted into the scan chains, and clocked through the scan chain at the internal scan chain data rate during capture cycles. The results are then shifted out from the device and delivered to the output connections of the corresponding SoC.

At 230, the method includes configuring a DSTA module for the logic block that is integrated within a first chip to a first bandwidth ratio. The first bandwidth ratio is configurable to match the delivery of the external scan data (e.g., the rate at which the test data is delivered from the ATE) and the delivery of the internal scan chain data (e.g., the rate the test data is delivered over the internal scan chains of the logic block). The matching may occur on a frequency level and/or channel width level. For example, the first bandwidth ratio defines the first plurality of SSI connections and a first plurality of PSI connections of the logic block, as previously described.

At 240, the method includes dividing the first external clock frequency down using the first bandwidth ratio to generate a first internal clock frequency. For example, a clock divider may perform the dividing process. The dividing is performed in accordance with the first bandwidth ratio, wherein the ratio also defines or is based on the rate at which the external scan data is input using the SSI connections, and the rate or frequency at which the internal scan chain data is clocked into the scan chains, as previously described. That is, the first bandwidth ratio also defines the first external clock frequency and the first internal clock frequency, which is based on the number of first plurality of SSI connections used for test access and the number of first plurality of PSI connections of the logic block.

In one embodiment, the matching of bandwidths (e.g., the external scan data rate and the internal scan chain data rate) is performed by changing the external scan data rate, while keeping the internal scan chain data rate the same, as originally designed for integration within a source SoC. For instance, the internal scan chain data rate is not varied in any derivative SoC incorporating the logic block, and the number of PSI connections used for testing in the logic block remain fixed. In another embodiment, the matching of bandwidths is performed by keeping the external data rate the same, and changing internal scan chain data rate. That is, the number of PSI connections used for testing in the logic block may change from one derivative SoC to another derivative SoC, both incorporating the logic block. In still another embodiment, the matching of bandwidths is performed by modifying both the external data rate and the internal scan data rate. As such, the utilization of channel bandwidth (e.g., for receiving input test data from the ATE) is maximized and/or optimized. In addition, by having the ability to change either the external data rate and/or the internal scan chain data rate, the scan shift into the internal scan chains can be run at a desired speed that is based on timing signoff.

At 250, the method includes scanning the test data over the first plurality of PSI connections clocked at the first internal clock frequency. The PSI connections are configured for inputting the test data into the scan chains of the logic block. The scanning is performed in accordance with the first bandwidth ratio. That is, the scanning of the test data, received over faster but narrower connections (e.g., SSIs), is performed over slower but wider connections (e.g., PSIs), wherein the scan rate and the number of internal connections is in accordance with the bandwidth ratio.

More particularly, the test data is collected over a first number of external clock cycles. That is, for each SSI connection, test data is collected over the first number of external clock cycles. Because of the relationships between frequencies and clock cycles, the first bandwidth ratio also defines the higher, first number of external clock cycles running at the first external clock frequency and a lower, first number of internal clock cycles running at the first internal clock frequency. As such, the test data collected over all the SSI connections over the first number of external clock cycles is then scanned over the first plurality of PSI connections over the first number of internal clock cycles.

That is, test data collected over each SSI connection is scanned over a corresponding number of PSI connections, in accordance with the bandwidth ratio. In particular, for each SSI connection, a corresponding first subset of test data is collected over the first number of external clock cycles. Thereafter, the corresponding first subset of test data is scanned over a corresponding first number of PSI connections over the first number of internal clock cycles using the internal clock frequency, wherein the first bandwidth ratio defines the first number of PSI connections, and the first number of SSI connections (in this case—one). For example, for a 4-to-1 ratio, the test data collected over one SSI connection, and over four fast clock cycles, is spread out over four PSI connections, and over one slow clock cycle, wherein the number of internal clock cycles is equal to one. The bandwidth ratio may be performed using various ratios having denominators equal to or greater than one, and other techniques, such as channel and frequency multiplexing, in embodiments of the present invention.

In addition, the plurality of scan chains will output results during testing. That is, concurrent with or after the test data is shifted into the scan chains, results are then shifted out from the logic block using the PSO connections and routed to the system output connections, such as output connections of the corresponding SoC. Specifically, output data clocked at the internal clock frequency is received from the plurality of scan chains over a first plurality of PSO connections associated with the logic block. The output data is serialized and scanned over a plurality of SSO connections clocked at the first external clock frequency.

In one embodiment, the output data is serialized in accordance with the first bandwidth ratio. As such, the first bandwidth ratio defines the first plurality of PSO connections and the first plurality of SSO connections. Since the deserialization and serialization are performed in accordance with the first bandwidth ratio, the number of SSI connections is equal to the number of SSO connections, and the number of PSI connections is equal to the number of PSO connections (which also defines the number of scan chains). In that manner, the output data is scanned to the SSO connections according to the first bandwidth ratio, such that the output data is collected from the first plurality of PSO connections over said first number of internal clock cycles at said first internal clock frequency, and scanned over the first plurality of SSO connections over said first number of external clock cycles at the first external clock frequency. For example, for a 4-to-1 ratio, the test results collected over four PSO connections, and over one slow clock cycle, is collected and delivered over one SSO connection over one four fast clock cycles, wherein the number of internal clock cycles is equal to one.

For clarification, the bandwidth ratio defines a number of interrelated factors and/or components. As previously described, the bandwidth ratio defines the external frequency used to input test data from the ATE and the internal scan chain frequency used to scan test data across the scan chains in the logic block; the number of SSI to PSI connections; the number of external clocks used for collecting test data across the SSI connections and the number of internal clocks used for scanning test data across the PSI connections; the number of PSO connections to SSO connections, the number of internal clocks used for collecting test results across the PSO connections and the number of external clocks used for scanning test results across the SSO connections; and the internal scan chain frequency used to deliver test results across the PSO connections and the external frequency used to scan test results across the SSO connections.

In another embodiment, the output data is serialized in general. That is, serialization does not occur in accordance with the first bandwidth ratio. For example, the testing may be designed to produce a small amount of data. Instead of using all of the available SSO connections for outputting test results, a fewer number of SSO connections are utilized, and possibly over a fewer number of clock cycles. That is, the bandwidth ratio on the output side may be different than the bandwidth ratio on the input side of the logic block.

In one embodiment, bi-directional communication is implemented, such that the first plurality of SSI connections of the logic block includes at least one of the plurality of SSO connections. With bi-directional control, a connection may provide both input and output functionality. In that case, an SSI/SSO connection may receive input test data at one time, and output test results at a different time.

Because the DSTA modules provide configurable bandwidth ratios to be used for a particular logic block, that logic block may be incorporated into a derivative SoC possibly having a different number of access connections. In addition, the test pattern designed for testing the logic block incorporated into the source SoC may also be used for testing eh logic block that is now incorporated into the derivative SoC. By configuring the DSTA models associated with the logic block (e.g., either at the local level in the logic block, or at the system level in the SoC incorporating the logic block), the bandwidth ratio selected will match the external data rate to the internal scan data rate given the number of physically available external access connections, though not all may be utilized. For example, a DSTA module will be configured for the logic block that is integrated within a second, derivative chip to a second bandwidth ratio. The second bandwidth ratio defines a second plurality of SSI connections and a second plurality of PSI connections. The SSI access connections are used for inputting the test results from the ATE, such that the second plurality of SSI connections is configured for receiving the test data clocked at a second external clock frequency. In addition, the second plurality of PSI connections is configured for inputting the test data to the plurality of scan chains according to the second bandwidth ratio. In addition, the second bandwidth ratio also defines the second external clock frequency and the second internal clock frequency.

In one embodiment, the first plurality of PSI connections is identical to the second plurality of PSI connections, even though the first and second bandwidth ratios may be different. That is, internal to the logic block, the same number of physical PSI connections are used to input test data to the scan chains. To optimize testing, all of the PSI connections should be utilized given the different bandwidth ratios, or at least a maximum number of PSI should be utilized.

FIGS. 3A-E are block diagrams illustrating the implementation of DSTA modules for a logic block design integrated within five different SoC configurations, wherein the DSTA module is configured to implement flexible bandwidth ratios for test pattern reuse such that each SoC configuration is accessed using a corresponding bandwidth ratio, in accordance with embodiments of the present disclosure. That is, individual logic blocks of similar design can be run at different bandwidth ratios depending on the access abilities of different SoC platforms incorporating those logic blocks, and how timing signoff is accomplished for those logic blocks.

The logic blocks shown in FIGS. 3A-E are similar in that they contain the same integrated circuit configuration; however, each is configured with a different bandwidth ratio to match corresponding an external data rate from an ATE to an internal scan data rate of the logic block—as they are incorporated in different SoC platforms. FIGS. 3A-E are provided for illustration of the implementation of DSTA load and unload modules for configuring bandwidth ratios between the external scan data rate and the internal scan chain data rate associated with a particular logic block. That is, while certain bandwidth ratios are provided for illustration in FIGS. 3A-E, other differently configured bandwidth ratios for the particular logic block may be supported. By providing flexible and configurable bandwidth ratios, scan access pin requirements can be further reduced while still matching the data bandwidths between high speed scan data rate from ATE and internal scan chains data rate in order to fully utilize the available channel bandwidths of ATE data, load deserializer, and unload serializer scan architectures.

For each logic block shown in FIGS. 3A-E, the DSTA modules may be built on an existing fixed bandwidth ratio design, wherein embodiments of the present invention allow for configuring the bandwidth ratios to match the data bandwidth between high speed scan data from the ATE and internal scan chains of the logic block, as the logic block is incorporated into a corresponding SoC. For example, for logic block reuse, where the logic block is taken into a SoC with lesser connections (compared to the source/original SoC for which the logic block was designed, and where the test patterns were originally generated), the DSTA modules can be configured to operate at a higher ratio to match the high speed scan data rate from ATE and the internal scan chains data rate. In that manner, the existing test pattern for testing the logic block may be used for multiple SoC configurations with some formatting (e.g., configuring the bandwidth ratio).

It is understood, however, that in other embodiments, the DSTA modules are built on logic blocks that have flexible bandwidth ratio designs, in which case embodiments of the present invention still allow for configuring the bandwidth ratios to match the data bandwidth between high speed scan data from the ATE and internal scan chains of the logic block, as the logic block is incorporated into a corresponding SoC. For instance, the internal scan chain data rate may be configurable within a particular logic block design.

In one embodiment the connections internal to the logic block (e.g., PSI/PSO) may remain fixed in each of the reuse cases shown in FIGS. 3A-E, although not all of the connections may be utilized in order to satisfy a corresponding bandwidth ratio. The unused SSIs/SSOs (which are connected to the SI/SO of the logic block) can be tied off or unconnected inside the "SOC NVSCANLINK," in one embodiment. In this case, the loss in SSI/SSO is made up for by increasing the frequency of the fast clock, which in turn increases the rate at which SSI/SSO can be supplied or consumed. In other embodiment, the connections internal to the logic block may also be configurable to support various bandwidth ratios.

As shown in FIGS. 3A-E, internal to the logic block, scan chains connected to the PSI/PSO connections can operate at a fixed, slow clock frequency as timed originally for the source SoC. A fast clock to slow clock divider is configured to accomplish this. For example, on the tester of the ATE, the probe card (during wafer level test) can supply a 500 MHz fast clock. To support 24-to-1, 12-to-1, 8-to-1, 6-to-1 and 4-to-1 bandwidth ratios, the clock dividers need to support those same ratios. The slow clock signal 302 is fixed and operated at 62.5 MHz in FIGS. 3A-E. Based on the dynamic ratio requirements of this modules, the fast clock can be operated at 500/375/250 MHz from SoC to SoC. In other embodiments, the slow clock frequency may be configurable so that the data rate for the scan chains connected to PSI/PSO connections can operate at different frequencies, and be supported by different bandwidth ratios.

FIG. 3A shows the implementation of DSTA modules within a logic block 300A configured to operate at a default 4-to-1 bandwidth ratio, wherein each fast scan input (SSI) can drive up to four internal PSI connections of the logic block 300A. In accordance with the 4-to-1 bandwidth ratio, the SSI connections are operating four times faster than the PSI connections.

As shown a first plurality of SSI connections is configured for supplying test data clocked at a first external clock frequency by an external clock signal 301 (e.g., provided by ATE). The test data is designed for testing a logic block when input to a plurality of scan chains of the logic block 300A. For example, six SSI connections (e.g., SSI-0, SSI-1, SSI-2, SSI-3, SSI-4, and SSI-5) are loaded with representative test data (e.g., "A-B-C-D"). For illustration, "A-B-C-D" test data is input into each SSI connection over four clock cycles in accordance with the bandwidth ratio. However, it is understood that each SSI connection may include different test data, such that SSI-0 may contain test data "A0-B0-C0-D-0", and SSI-1 may contain test data "A1-B-1-C-1-D- 1," etc.

Figure 3B:
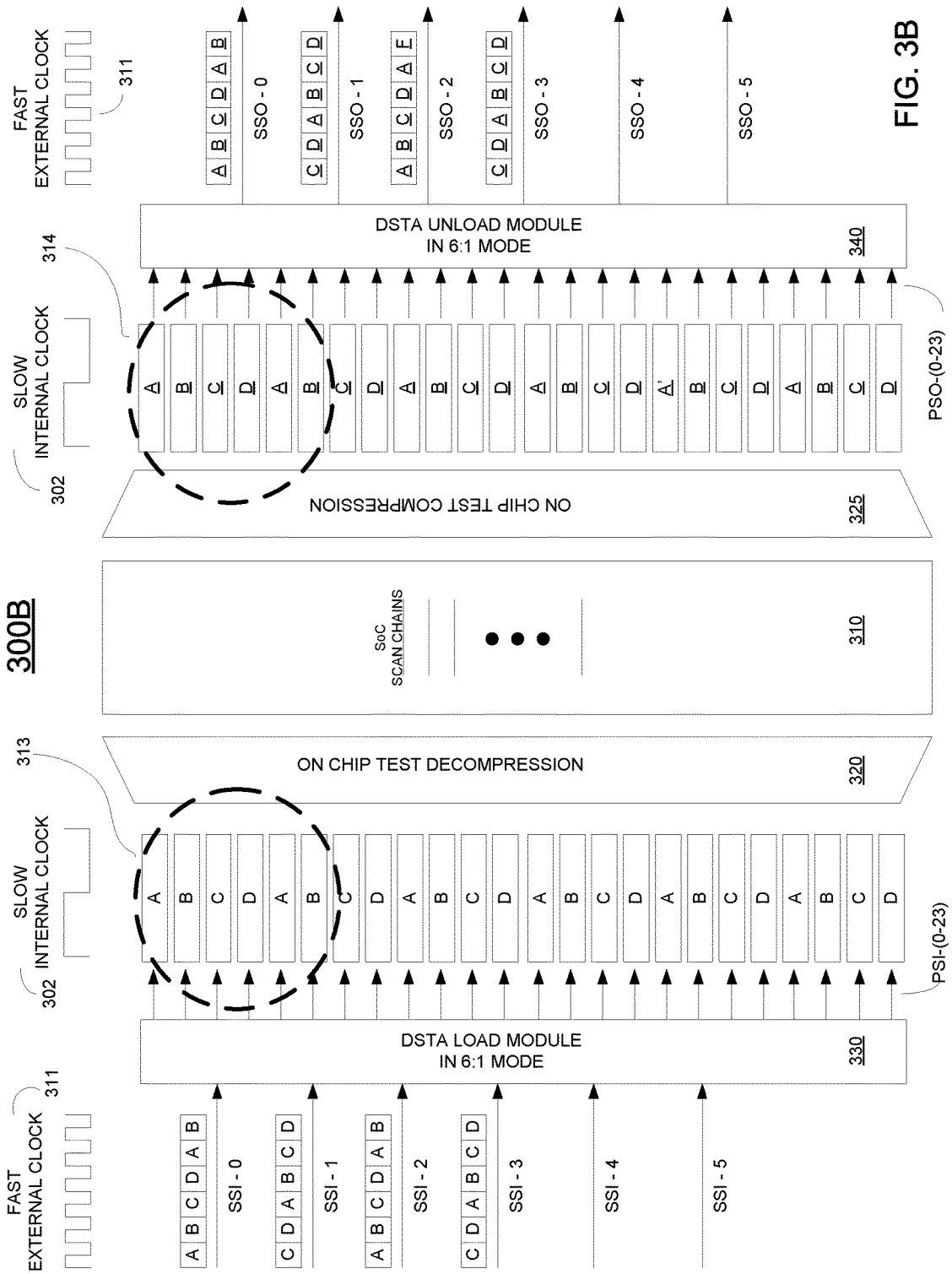

As previously described, the test data is input into a DSTA load module 330, which in FIG. 3A is configured to operate at a 4-to-1 bandwidth ratio. The DSTA load module 330 deserializes the test data to spread the data over more PSI connections at a slower rate. As a representative example of each of the SSI connections, the test data over the SSI-0 connection and collected over four clock cycles of the fast clock signal 301 (e.g., containing "A-B-C-D" test data) is delivered over four PSI connections (e.g., PSI-(0-3) over one clock cycle of the slow clock signal 302, as highlighted by the dashed circle 303. Given the 4-to-1 bandwidth ratio of FIG. 3A, the test data delivered over six SSI connections (e.g., SSI-(0-5) are spread across twenty-four PSI channels (e.g., PSI-(0- 23)). Since the same test pattern is reused in each of the logic blocks 300A-E of FIGS. 3A-E, the test data is scanned into the scan chains 310 identically from PSI-(0-23 ) in each of the logic blocks 300A-E using the same slow clock signal 302. In this case, all of the physical SSI connections are utilized to satisfy the 4-to-1 bandwidth ratio.

As shown in FIGS. 3A-E, in an attempt to standardize the connectivity in this specific use case, the number of PSI and PSO connections per DSTA module pair (load and/or unload) is fixed at twenty-four. As such, the dynamic bandwidth ratio can be configured identically for all logic blocks (of similar design) in a particular SoC. In another embodiment, the DSTA module pairs may support different bandwidth ratios across the logic block for lower channel depth resulting in low probe card memories.

The deserialized test data from the PSI connections (e.g., PSI-(0-23)) is optionally decompressed by the on chip test decompression module 320, if the test data was originally compressed by the ATE. After decompression, the test data is delivered from the PSI connections to the corresponding scan chins 310. As shown, the PSI connections and scan chains are configured in a one-to-one relationship.

Embodiments of the present invention providing configurable DSTA modules associated with a particular logic block to achieve different bandwidth ratios are implemented with logic blocks configured for decompression/compression, or for logic blocks that do not implement any decompression/compression of the test data and test results during production testing or online system level testing. In addition, the logic blocks configured with decompression/compression of the test data and test results can support various types of scan compression/decompression techniques.

The test results shifting out of the scan chains 310 is then optionally compressed by the on chip test compression module 325 and delivered to corresponding PSO connections, if the logic block is configured for compression/decompression. For example, after compression the test results associated with the test data input over PSI-(0- 3) connections are output from the scan chains over the PSO-(0-3) connections. As shown, the PSI connections, scan chains, and PSO connections are configured in a one-to-one-to-one relationship.

After compression, the test results are delivered from the PSO-(0-23) connections to the DSTA unload module 340, which in FIG. 3A is configured to operate at a 4-to-1 bandwidth ratio. The DSTA unload module 340 serializes the test results to consolidate the test results over fewer SSO connections, but at a higher rate. As a representative example of each of the SSO connections, the test results collected over PSO-(0-3) connections containing "<u>A</u>-<u>B</u>-<u>C</u>-<u>D</u>" test results are serialized for delivery over the SSI-0 connection, as highlighted by the dashed circle 304. For example, the test results over four PSO-(0-3) connections and collected over one clock cycle of the slow clock signal 302 are outputted over a single SSO-0 connection over four cycles of the fast external clock signal 301. Given the 4-to-1 bandwidth ratio of FIG. 3A, the test results delivered over twenty-four PSO-(0-23) connections are consolidated across six SSO-(0-5) connections. In this case, all of the physical SSO connections are utilized to satisfy the 4-to-1 bandwidth ratio.

FIG. 3B shows the implementation of DSTA modules within a logic block 300B configured to operate at a 6-to-1 bandwidth ratio, wherein each fast scan input (SSI) can drive up to six internal PSI connections of the logic block 300B. In accordance with the 6-to-1 bandwidth ratio, the SSI connections are operating six times faster than the PSI connections. The logic block 300B is of the same design as logic block 300A of FIG. 3A (e.g., include the same components PSI, compression/decompression modules, scan chains, PSO, DSTA modules, etc.), but is configured for a 6-to-1 bandwidth ratio.

As shown, a first plurality of SSI connections is configured for supplying test data clocked at a first external clock frequency by an external clock signal 311 (e.g., provided by ATE). The first plurality of SSI connections utilized is less than the number of physically available SSI connections to satisfy the 6-to-1 bandwidth ratio. The test data is designed for testing a logic block when input to a plurality of scan chains of the logic block 300B. For example, four SSI connections (e.g., SSI-0, SSI-1, SSI-2, and SSI-3) are loaded with representative test data (e.g., "A-B-C-D") in various configurations over six clock cycles in accordance with the bandwidth ratio, as follows: "A-B-C-D-A-B" test data is input into SSI-0; "C-D-A-B-C-D" test data is input into SSI-1; "A-B-C-D-A-B" test data is input into SSI-2, and "C-D-A-B-C-D" test data is input into SSI-3. However, it is understood that each SSI connection may include different test data, such that SSI-0 may contain test data "A0-B0-C0-D0-A1-B1", and SSI-1 may contain test data "C1-D1-A2-B2-C2-D2," etc.

As previously described, the test data is input into a DSTA load module 330, which in FIG. 3B is configured to operate at a 6-to-1 bandwidth ratio. The DSTA load module 330 deserializes the test data to spread the data over more PSI connections at a slower rate. As a representative example of each of the SSI connections, the test data over the SSI-0 connection and collected over six clock cycles of the fast clock signal 311 (e.g., containing "A-B-C-D-A-B" test data) is delivered over six PSI connections (e.g., PSI-(0-5)) over one clock cycle of the slow clock signal 302, as highlighted by the dashed circle 313. Given the 6-to-1 bandwidth ratio of FIG. 3B, the test data delivered over four SSI channels (e.g., SSI-(0-3) are spread across twenty-four PSI channels (e.g., PSI-(0-23)). Since the same test pattern is reused in each of the logic blocks 300A-E of FIGS. 3A-E, the test data is scanned into the scan chains 310 identically from PSI-(0-23) in each of the logic blocks 300A-E using the same slow clock signal 302. In this case, four of the six physical SSI connections are utilized to satisfy the 6-to-1 bandwidth ratio.

The deserialized test data from the PSI connections (e.g., PSI-(0-23)) is optionally decompressed by the on chip test decompression module 320, if the test data was originally compressed by the ATE. After decompression, the test data is delivered from the PSI connections to the corresponding scan chins 310. As shown, the PSI connections and scan chains are configured in a one-to-one relationship.

The test results shifting out of the scan chains 310 is then optionally compressed by the on chip test compression module 325 and delivered to corresponding PSO connections, if the logic block is configured for compression/decompression. For example, after compression the test results associated with the test data input over PSI-(0-5) connections are output from the scan chains over the PSO- (0-5) connections. As shown, the PSI connections, scan chains, and PSO connections are configured in a one-to-one-to-one relationship.

After compression, the test results are delivered from the PSO-(0-23) connections to the DSTA unload module 340, which in FIG. 3B is configured to operate at a 6-to-1 bandwidth ratio. The DSTA unload module 340 serializes the test results to consolidate the test results over fewer SSO connections, but at a higher rate. As a representative example of each of the SSO connections, the test results collected over PSO-(0-5) connections containing "A-B-C-D-A-B" test results are serialized for delivery over the SSI-0 connection, as highlighted by the dashed circle 314. For example, the test results over six PSO-(0-5) connections and collected over one clock cycle of the slow clock signal 302 are outputted over a single SSO-0 connection over six cycles of the fast external clock signal 311. Given the 6-to-1 bandwidth ratio of FIG. 3B, the test results delivered over twenty-four PSO-(0-23) connections are consolidated across four SSO-(0-3) connections. In this case, four of the six physical SSO connections are utilized to satisfy the 6-to-1 bandwidth ratio.

Figure 3C:
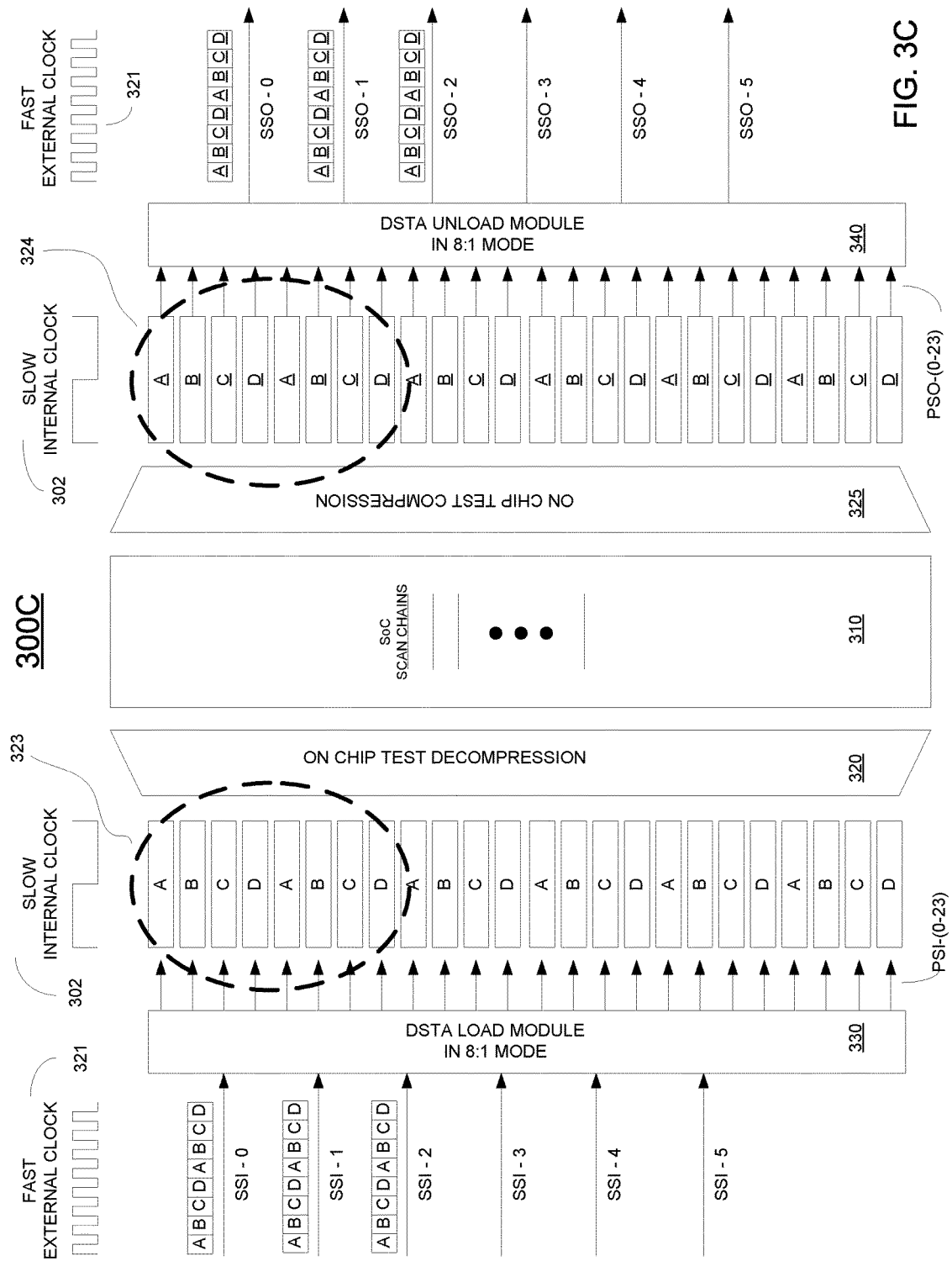

FIG. 3C shows the implementation of DSTA modules within a logic block 300C configured to operate at an 8-to-1 bandwidth ratio, wherein each fast scan input (SSI) can drive up to eight internal PSI connections of the logic block 300C. In accordance with the 8-to-1 bandwidth ratio, the SSI connections are operating eight times faster than the PSI connections. The logic block 300C is of the same design as logic blocks 300A-B of FIGS. 3A-B (e.g., include the same components PSI, compression/decompression modules, scan chains, PSO, DSTA modules, etc.), but is configured for an 8-to-1 bandwidth ratio.

As shown, a first plurality of SSI connections is configured for supplying test data clocked at a first external clock frequency by an external clock signal 321 (e.g., provided by ATE). The first plurality of SSI connections utilized is less than the number of physically available SSI connections to satisfy the 8-to-1 bandwidth ratio. The test data is designed for testing a logic block when input to a plurality of scan chains of the logic block 300C. For example, three SSI connections (e.g., SSI-0, SSI-1, and SSI-2) are loaded with representative test data (e.g., "A-B-C-D", etc.) in various configurations over eight clock cycles in accordance with the bandwidth ratio, as follows: "A-B-C-D-A-B-C-D" test data is input into SSI-0; "A-B-C-D-A-B-C-D" test data is input into SSI-1; and "A-B-C-D-A-B-C-D" test data is input into SSI-2. However, it is understood that each SSI connection may include different test data, such that SSI-0 may contain test data "A0-B 0-C0-D0-A1-B1-C1-D1", and SSI-1 may contain test data "A2-B2-C2-D2-A3-B3-C3-D3," etc.

As previously described, the test data is input into a DSTA load module 330, which in FIG. 3C is configured to operate at an 8-to-1 bandwidth ratio. The DSTA load module 330 deserializes the test data to spread the data over more PSI connections at a slower rate. As a representative example of each of the SSI connections, the test data over the SSI-0 connection and collected over eight clock cycles of the fast clock signal 321 (e.g., containing "A-B-C-D-A-B-C-D" test data) is delivered over eight PSI connections (e.g., PSI-(0-7)) over one clock cycle of the slow clock signal 302, as highlighted by the dashed ellipse 323. Given the 8-to-1 bandwidth ratio of FIG. 3C, the test data delivered over three SSI channels (e.g., SSI-(0-2) are spread across twenty-four PSI channels (e.g., PSI-(0-23)). Since the same test pattern is reused in each of the logic blocks 300A-E of FIGS. 3A-E, the test data is scanned into the scan chains 310 identically from PSI-(0-23) in each of the logic blocks 300A-E using the same slow clock signal 302. In this case, three of the six physical SSI connections are utilized to satisfy the 8-to-1 bandwidth ratio.

The deserialized test data from the PSI connections (e.g., PSI-(0-23)) is optionally decompressed by the on chip test decompression module 320, if the test data was originally compressed by the ATE. After decompression, the test data is delivered from the PSI connections to the corresponding scan chins 310. As shown, the PSI connections and scan chains are configured in a one-to-one relationship.

The test results shifting out of the scan chains 310 is then optionally compressed by the on chip test compression module 325 and delivered to corresponding PSO connections, if the logic block is configured for compression/decompression. For example, after compression the test results associated with the test data input over PSI-(0-7) connections are output from the scan chains over the PSO-(0-7) connections. As shown, the PSI connections, scan chains, and PSO connections are configured in a one-to-one-to-one relationship.

After compression, the test results are delivered from the PSO-(0-23) connections to the DSTA unload module 340, which in FIG. 3C is configured to operate at an 8-to-1 bandwidth ratio. The DSTA unload module 340 serializes the test results to consolidate the test results over fewer SSO connections, but at a higher rate. As a representative example of each of the SSO connections, the test results collected over PSO-(0-7) connections containing "A-B-C-D-A-B-C-D" test results are serialized for delivery over the SSI-0 connection, as highlighted by the dashed ellipse 324. For example, the test results over eighth PSO-(0-7) connections and collected over one clock cycle of the slow clock signal 302 are outputted over a single SSO-0 connection over eight cycles of the fast external clock signal 321. Given the 8-to-1 bandwidth ratio of FIG. 3C, the test results delivered over twenty-four PSO-(0-23) connections are consolidated across three SSO-(0-2) connections. In this case, three of the six physical SSO connections are utilized to satisfy the 8-to-1 bandwidth ratio.

Figure 3D:
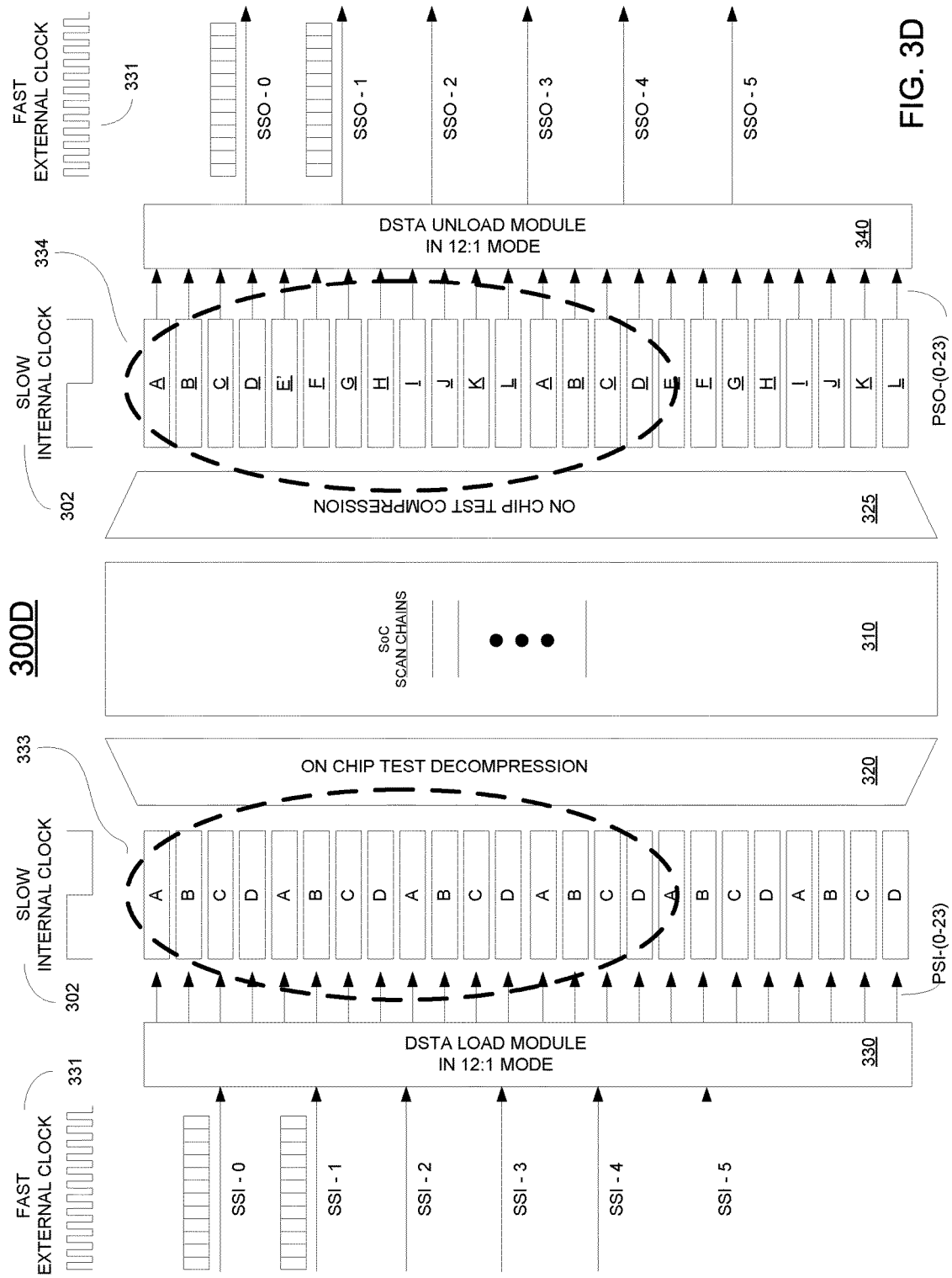

FIG. 3D shows the implementation of DSTA modules within a logic block 300D configured to operate at a 12-to-1 bandwidth ratio, wherein each fast scan input (SSI) can drive up to twelve internal PSI connections of the logic block 300D. In accordance with the 12-to-1 bandwidth ratio, the SSI connections are operating twelve times faster than the PSI connections. The logic block 300D is of the same design as logic blocks 300A-C of FIGS. 3A-C (e.g., include the same components PSI, compression/decompression modules, scan chains, PSO, DSTA modules, etc.), but is configured for a 12-to-1 bandwidth ratio.

As shown, a first plurality of SSI connections is configured for supplying test data clocked at a first external clock frequency by an external clock signal 331 (e.g., provided by ATE). The first plurality of SSI connections utilized is less than the number of physically available SSI connections to satisfy the 12-to-1 bandwidth ratio. The test data is designed for testing a logic block when input to a plurality of scan chains of the logic block 300D. For example, two SSI connections (e.g., SSI-0 and SSI-1) are loaded with representative test data (e.g., "A-B-C-D", etc.) in various configurations over twelve clock cycles in accordance with the bandwidth ratio, as follows: "A-B-C-D-A-B-C-D-A-B-C-D" test data is input into SSI-0; and "A-B-C-D-A-B-C-D-A-B-C-D" test data is input into SSI-1. However, it is understood that each SSI connection may include different test data, such that SSI-0 may contain test data "A0-B0-C0-

D0-A1-B1-C1-D1-A2-B2-C2-D2", and SSI-1 may contain test data "A3-B3-C3-D3-A4-B4-C4-D4-A5-B5-C5-D 5," etc.

As previously described, the test data is input into a DSTA load module 330, which in FIG. 3D is configured to operate at a 12-to-1 bandwidth ratio. The DSTA load module 330 deserializes the test data to spread the data over more PSI connections at a slower rate. As a representative example of each of the SSI connections, the test data over the SSI-0 connection and collected over twelve clock cycles of the fast clock signal 331 (e.g., containing "A-B-C-D-A-B-C-D-A-B-C-D" test data) is delivered over twelve PSI connections (e.g., PSI-(0-11)) over one clock cycle of the slow clock signal 302, as highlighted by the dashed ellipse 333. Given the 12-to-1 bandwidth ratio of FIG. 3D, the test data delivered over two SSI channels (e.g., SSI-(0-1) are spread across twenty-four PSI channels (e.g., PSI-(0-23)). Since the same test pattern is reused in each of the logic blocks 300A-E of FIGS. 3A-E, the test data is scanned into the scan chains 310 identically from PSI-(0-23) in each of the logic blocks 300A-E using the same slow clock signal 302. In this case, two of the six physical SSI connections are utilized to satisfy the 12-to-1 bandwidth ratio.

The deserialized test data from the PSI connections (e.g., PSI-(0-23)) is optionally decompressed by the on chip test decompression module 320, if the test data was originally compressed by the ATE. After decompression, the test data is delivered from the PSI connections to the corresponding scan chins 310. As shown, the PSI connections and scan chains are configured in a one-to-one relationship.

The test results shifting out of the scan chains 310 is then optionally compressed by the on chip test compression module 325 and delivered to corresponding PSO connections, if the logic block is configured for compression/decompression. For example, after compression the test results associated with the test data input over PSI-(0-11) connections are output from the scan chains over the PSO-(0-11) connections. As shown, the PSI connections, scan chains, and PSO connections are configured in a one-to-one-to-one relationship.

After compression, the test results are delivered from the PSO-(0-23) connections to the DSTA unload module 340, which in FIG. 3D is configured to operate at a 12-to-1 bandwidth ratio. The DSTA unload module 340 serializes the test results to consolidate the test results over fewer SSO connections, but at a higher rate. As a representative example of each of the SSO connections, the test results collected over PSO-(0-11) connections containing "A-B-C-D-A-B-C-DA-B-C-D" test results are serialized for delivery over the SSI-0 connection, as highlighted by the dashed ellipse 334. For example, the test results over twelve PSO-(0-11) connections and collected over one clock cycle of the slow clock signal 302 are outputted over a single SSO-0 connection over twelve cycles of the fast external clock signal 331. Given the 12-to-1 bandwidth ratio of FIG. 3D, the test results delivered over twenty-four PSO-(0-23) connections are consolidated across two SSO-(0-1) connections. In this case, two of the six physical SSO connections are utilized to satisfy the 12-to-1 bandwidth ratio.

Figure 3E:
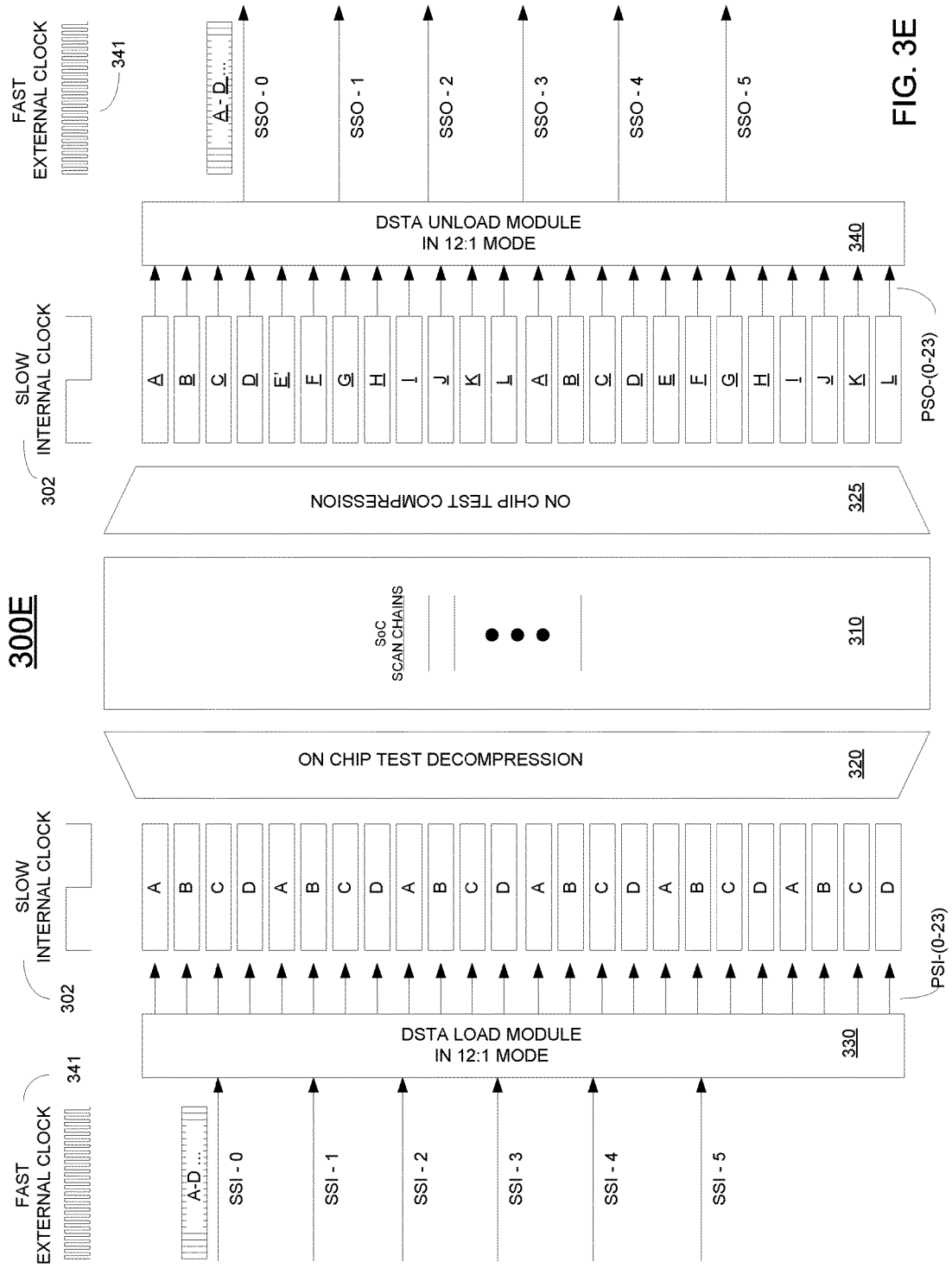

FIG. 3E shows the implementation of DSTA modules within a logic block 300E configured to operate at a 24-to-1 bandwidth ratio, wherein each fast scan input (SSI) can drive up to twenty-four internal PSI connections of the logic block 300E. In accordance with the 24-to-1 bandwidth ratio, the SSI connections are operating twenty-four times faster than the PSI connections. The logic block 300E is of the same design as logic blocks 300A-D of FIGS. 3A-D (e.g., include the same components PSI, compression/decompression modules, scan chains, PSO, DSTA modules, etc.), but is configured for a 24-to-1 bandwidth ratio.

As shown, a first plurality of SSI connections is configured for supplying test data clocked at a first external clock frequency by an external clock signal 341 (e.g., provided by ATE). The first plurality of SSI connections utilized is less than the number of physically available SSI connections to satisfy the 24-to-1 bandwidth ratio. The test data is designed for testing a logic block when input to a plurality of scan chains of the logic block 300E. For example, a single SSI connection (e.g., SSI-0) is loaded with representative test data (e.g., "A-B-C-D", etc.) in various configurations over twenty-four clock cycles in accordance with the bandwidth ratio, as follows: "A-B-C-D-A-B-C-D-A-B-C-D-A-B-C-D-A-B-C-D-A-B-C-D" test data is input into SSI-0.

As previously described, the test data is input into a DSTA load module 330, which in FIG. 3E is configured to operate at a 24-to-1 bandwidth ratio. The DSTA load module 330 deserializes the test data to spread the data over more PSI connections at a slower rate. As a representative example, the test data over the SSI-0 connection and collected over twenty-four clock cycles of the fast clock signal 341 (e.g., containing "A-B-C-D-A-B-C-D-A-B-C-D-A-B-C-D-A-B-C-D-A-B-C-D" test data) is delivered over twenty-four PSI connections (e.g., PSI-(0-23)) over one clock cycle of the slow clock signal 302. Given the 24-to-1 bandwidth ratio of FIG. 3E, the test data delivered over the single SSI-0 is spread across twenty-four PSI channels (e.g., PSI-(0-23)). Since the same test pattern is reused in each of the logic blocks 300A-E of FIGS. 3A-E, the test data is scanned into the scan chains 310 identically from PSI-(0-23) in each of the logic blocks 300A-E using the same slow clock signal 302. In this case, one of the six physical SSI connections are utilized to satisfy the 24-to-1 bandwidth ratio.

The deserialized test data from the PSI connections (e.g., PSI-(0-23)) is optionally decompressed by the on chip test decompression module 320, if the test data was originally compressed by the ATE. After decompression, the test data is delivered from the PSI connections to the corresponding scan chins 310. As shown, the PSI connections and scan chains are configured in a one-to-one relationship.

The test results shifting out of the scan chains 310 is then optionally compressed by the on chip test compression module 325 and delivered to corresponding PSO connections, if the logic block is configured for compression/decompression. For example, after compression the test results associated with the test data input over PSI-(0-23) connections are output from the scan chains over the PSO-(0-23) connections. As shown, the PSI connections, scan chains, and PSO connections are configured in a one-to-one-to-one relationship.

After compression, the test results are delivered from the PSO-(0-23) connections to the DSTA unload module 340, which in FIG. 3E is configured to operate at a 24-to-1 bandwidth ratio. The DSTA unload module 340 serializes the test results to consolidate the test results over fewer SSO connections, but at a higher rate. As a representative example of each of the SSO connections, the test results collected over PSO-(0-23) connections containing "A-B-C-D-A-B-C-D-A-B-C-D-A-B-C-D-A-B-C-D-A-B-C-D" test results are serialized for delivery over the SSI-0 connection. For example, the test results over twenty-four PSO-(0-23) connections and collected over one clock cycle of the slow clock signal 302 are outputted over a single SSO-0 connection over twenty-four cycles of the fast external clock signal 341. Given the 24-to-1 bandwidth ratio of FIG. 3E, the test results delivered over twenty-four PSO-(0-23) connections are consolidated across one SSO-0 connection. In this case, one of the six physical SSO connections are utilized to satisfy the 24-to-1 bandwidth ratio.

Figure 4:
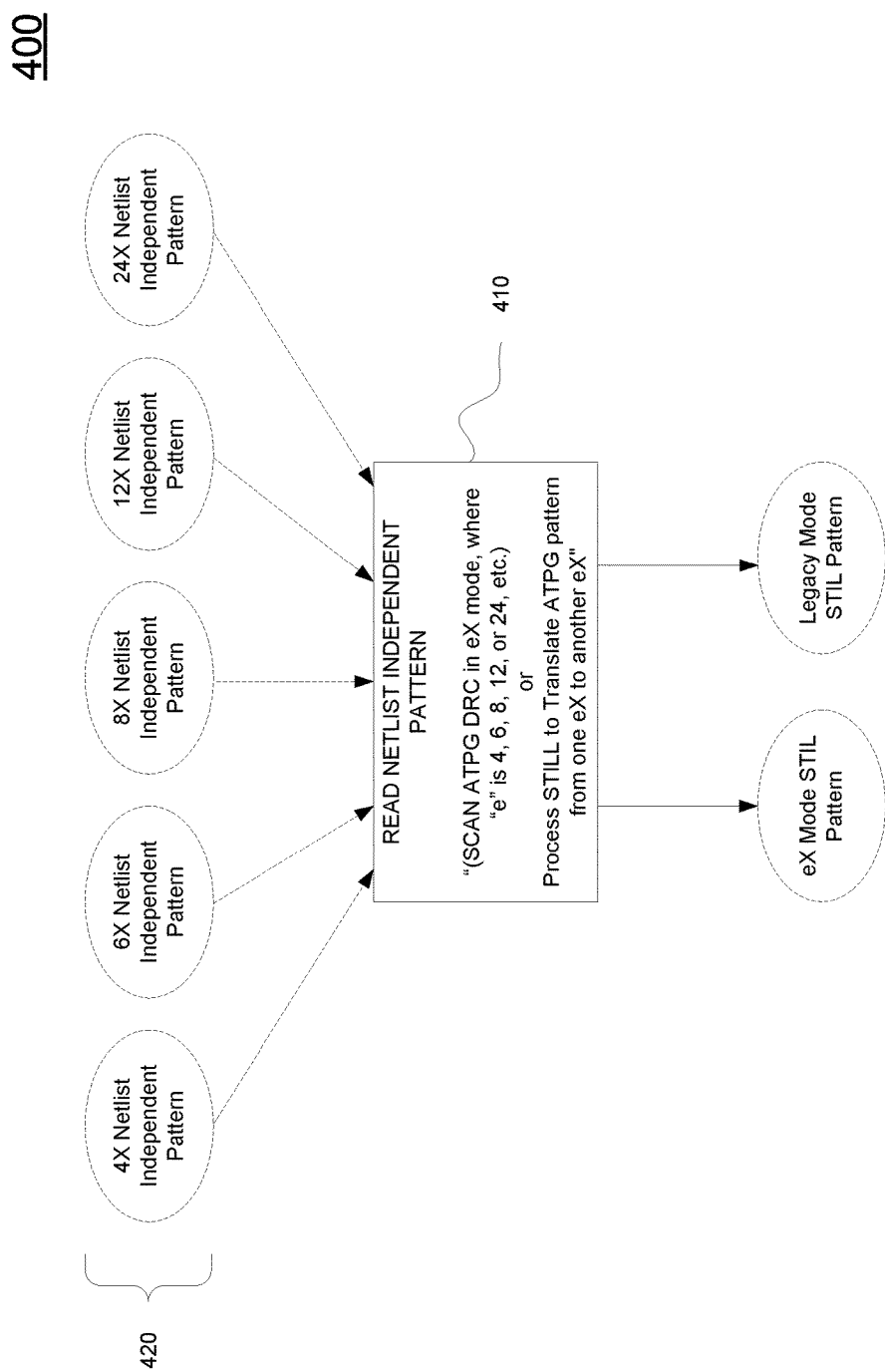
FIG. 4 is a diagram illustrating test pattern reuse of a logic block through the implementation of flexible bandwidth ratios of a DSTA module integrated within the logic block, in accordance with one embodiment of the present disclosure.

FIG. 4 is a diagram illustrating test pattern reuse of a logic block through the implementation of flexible bandwidth ratios of one or more DSTA modules integrated within the logic block, in accordance with one embodiment of the present disclosure. As shown, netlist patterns 420 having various bandwidth ratios (e.g., 4×, 8×, 12×, and 24×) are input into the test pattern generator 410. The test pattern generated is independent of the netlist patterns having different bandwidth ratios, but is formatted for proper input into the SSI connections. The output of the test pattern generator 410 provides various formats, including an eX Mode STIL Pattern, and a Legacy Mode Stil Pattern.

Figure 5:
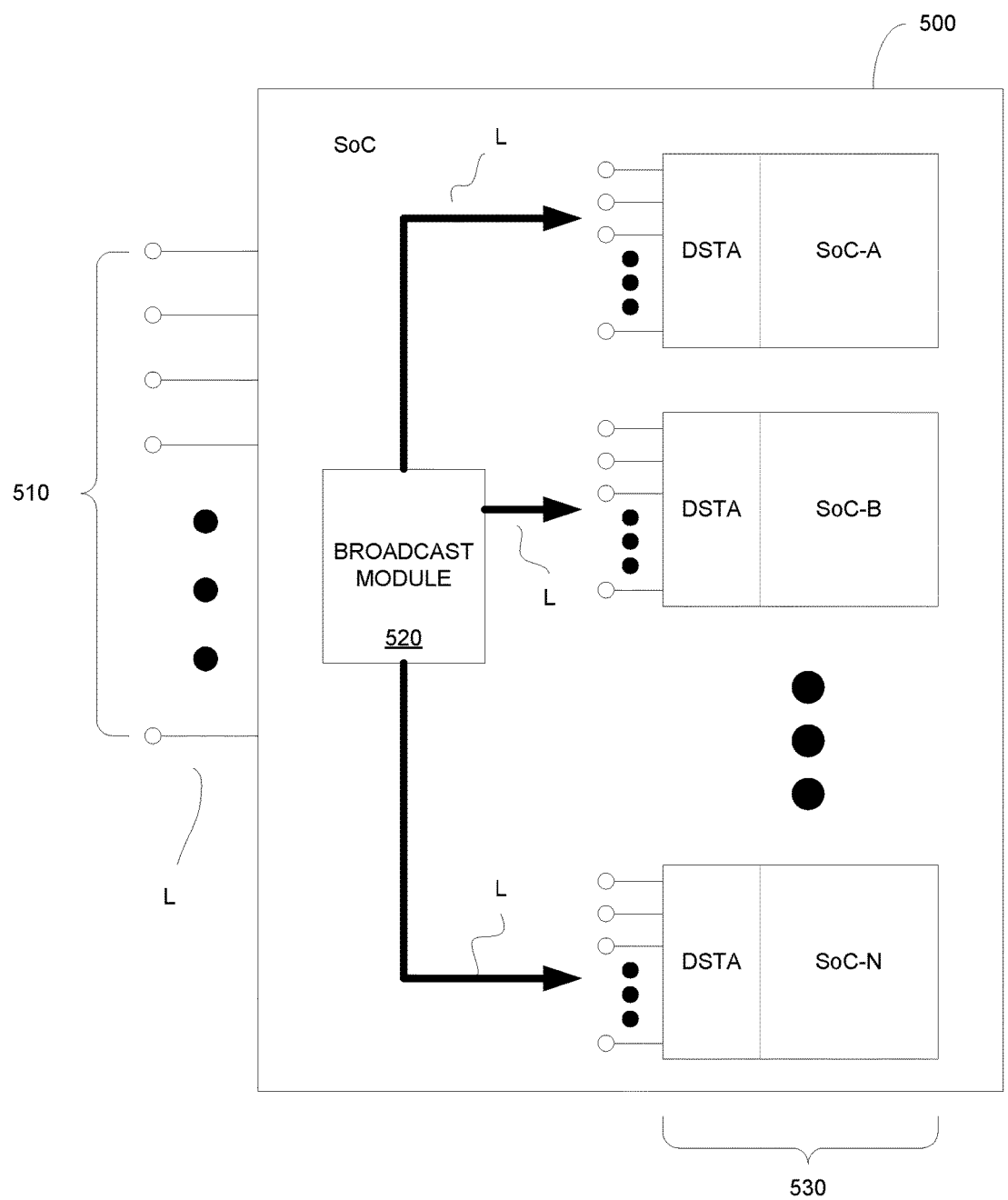
FIG. 5 is a diagram illustrating the broadcasting of a test pattern to multiple blocks of a single logic block, wherein the logic block includes a DSTA implementing flexible bandwidth ratios for test pattern reuse under different SoC configurations, in accordance with one embodiment of the present disclosure.

FIG. 5 is a diagram illustrating the broadcasting of a test pattern to a plurality of logic blocks 530 similarly designed, but included within a single SoC 500, wherein each logic block contained within the SoC 500 includes a DSTA implementing flexible bandwidth ratios for test pattern reuse under the single SoC 500 platform, in accordance with one embodiment of the present disclosure. For example, SoC 500 may include multiple logic blocks (e.g., 530A-N) of the same design (e.g., include the same components PSI, compression/decompression modules, scan chains, PSO, DSTA modules, etc.). Each of the logic blocks 530A-N can be tested using the same test data or pattern as scanned using the same bandwidth ratio. As shown in FIG. 5, the test data is broadcast at the system level (SoC 500) by the broadcast module 520 after the test data is received from the ATE. For example, the test data is received over "L" input connections (e.g., SSI) at the system level. The test data is internally routed to the broadcast module 520, and then broadcast over sets of L connections to each of the multiple logic blocks 530A-N. For example, the test data is broadcast over a super plurality of SSI connections associated with the logic blocks 530A-N. The test data is clocked at a first external clock frequency (e.g., fast clock provided by the ATE). The super plurality of SSI connections includes the first plurality of SSI connections (e.g., numbering "L") used for accessing logic block 330A, a second plurality of SSI connections (numbering "L") used for accessing logic block 330B, and other pluralities of SSI connections configured for testing other similarly designed logic blocks.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "generating," "supplying," "configuring," "dividing," "scanning," or the like, refer to actions and processes (e.g., in flowchart 2 of the present Application) of a computer system or similar electronic computing device or processor (e.g., computer system 600 of FIG. 6). The computer system or similar electronic computing device manipulates and transforms data represented as physical (electronic) quantities within the computer system memories, registers or other such information storage, transmission or display devices.

Other embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared and other wireless media. Combinations of any of the above can also be included within the scope of computer-readable media.

Figure 6:
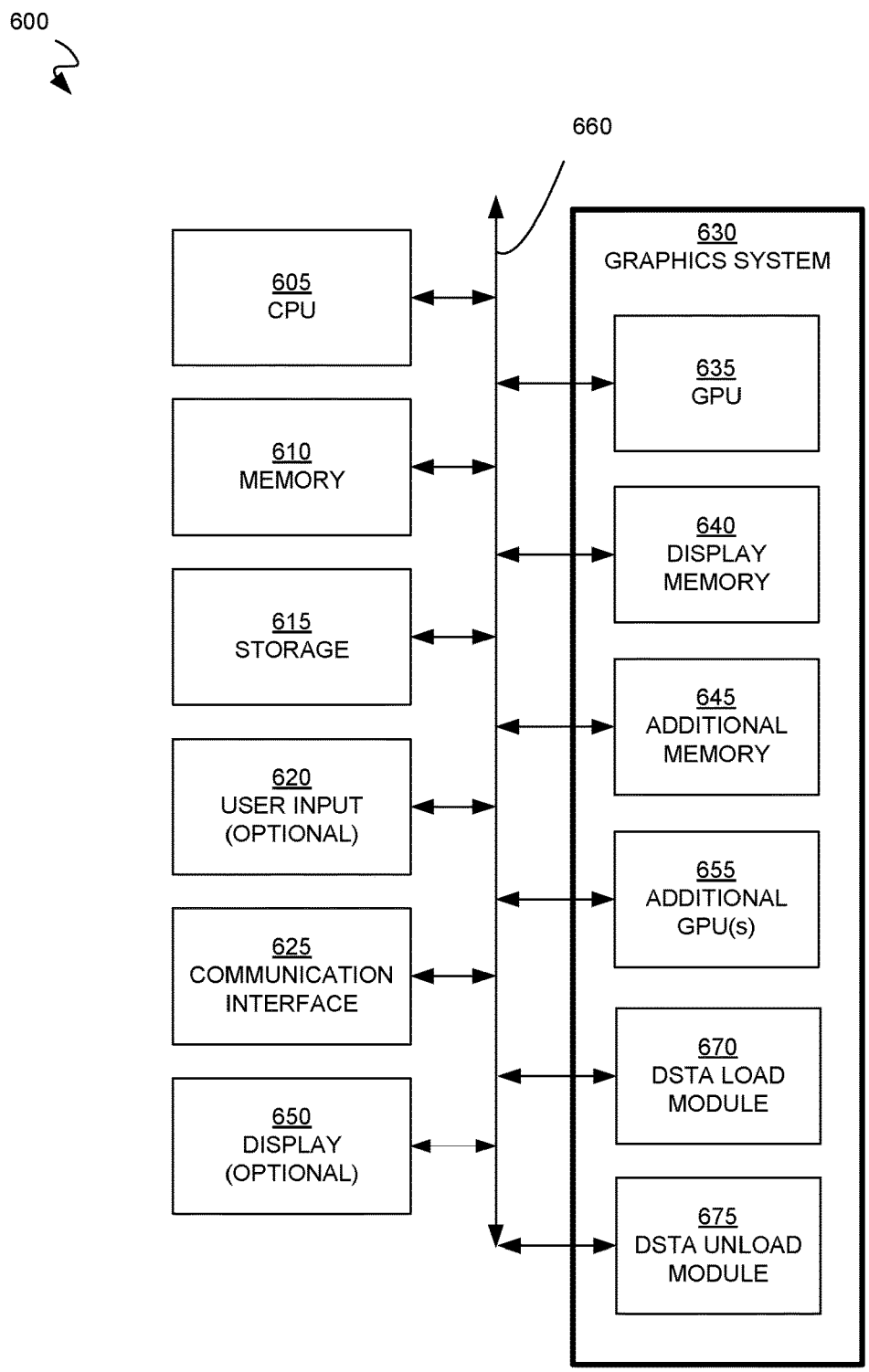
FIG. 6 depicts a block diagram of an exemplary computer system suitable for implementing embodiments according to the present disclosure.

FIG. 6 is a block diagram of an example of a computing system 600 capable of implementing embodiments of the present disclosure. Computing system 600 broadly represents any single or multi-processor computing device or system capable of executing computer-readable instructions. Examples of computing system 600 include, without limitation, workstations, laptops, client-side terminals, servers, distributed computing systems, handheld devices, gaming systems, gaming controllers, or any other computing system or device. In its most basic configuration, computing system 600 may include at least one processor 605 and a system memory 610.

It is appreciated that computer system 600 described herein illustrates an exemplary configuration of an operational platform upon which embodiments may be implemented to advantage. Nevertheless, other computer system with differing configurations can also be used in place of computer system 600 within the scope of the present invention. That is, computer system 600 can include elements other than those described in conjunction with FIG. 6.

Moreover, embodiments may be practiced on any system which can be configured to enable it, not just computer systems like computer system 600. It is understood that embodiments can be practiced on many different types of computer systems 600. System 600 can be implemented as, for example, a desktop computer system or server computer system having a power general-purpose CPUs coupled to a dedicated graphics rendering GPU. In such an embodiment, components can be included that add peripheral buses, specialized audio/video components, I/O devices, and the like. Similarly, system 600 can be implemented as a hand-held device (e.g., cell phone, etc.) or a set-top video game console device, such as, for example Xbox®, available from Microsoft corporation of Redmond, Wash., or the PlayStation3®, available from Sony Computer Entertainment Corporation of Tokyo, Japan, or the any of the SHIELD Portable devices (e.g., handheld gaming console, tablet computer, television set-top box, etc.) available from Nvidia Corp. System 600 can also be implemented as a "system on a chip", where the electronics (e.g., the components 605, 610, 615, 620, 625, 630, 650, and the like) of a computing device are wholly contained within a single integrated circuit die. Examples include a hand-held instrument with a display, a car navigation system, a portable entertainment system, and the like.

In the example of FIG. 6, the computer system 600 includes a central processing unit (CPU) 605 for running software applications and optionally an operating system. Memory 610 stores applications and data for use by the CPU 605. Storage 615 provides non-volatile storage for applications and data and may include fixed disk drives, removable disk drives, flash memory devices, and CD-ROM, DVD-ROM or other optical storage devices. The optional user input 620 includes devices that communicate user inputs from one or more users to the computer system 600 and may include keyboards, mice, joysticks, touch screens, and/or microphones.

The communication or network interface 625 allows the computer system 600 to communicate with other computer systems via an electronic communications network, including wired and/or wireless communication and including the internet. The optional display device 650 may be any device capable of displaying visual information in response to a signal from the computer system 600. The components of the computer system 600, including the CPU 605, memory 610, data storage 615, user input devices 620, communication interface 625, and the display device 650, may be coupled via one or more data buses 660.

In the embodiment of FIG. 6, a graphics system 630 may be coupled with the data bus 660 and the components of the computer system 600. The graphics system 630 may include a physical graphics processing unit (GPU) 635 and graphics memory. The GPU 635 generates pixel data for output images from rendering commands. The physical GPU 635 can be configured as multiple virtual GPUs that may be used in parallel (concurrently) by a number of applications executing in parallel.

Graphics memory may include a display memory 640 (e.g., a frame buffer) used for storing pixel data for each pixel of an output image. In another embodiment, the display memory 640 and/or additional memory 645 may be part of the memory 610 and may be shared with the CPU 605. Alternatively, the display memory 140 and/or additional memory 645 can be one or more separate memories provided for the exclusive use of the graphics system 630.

In another embodiment, graphics processing system 630 includes one or more additional physical GPUs 655, similar to the GPU 635. Each additional GPU 655 may be adapted to operate in parallel with the GPU 635. Each additional GPU 655 generates pixel data for output images from rendering commands. Each additional physical GPU 655 can be configured as multiple virtual GPUs that may be used in parallel (concurrently) by a number of applications executing in parallel. Each additional GPU 655 can operate in conjunction with the GPU 635 to simultaneously generate pixel data for different portions of an output image, or to simultaneously generate pixel data for different output images.

Each additional GPU 655 can be located on the same circuit board as the GPU 635, sharing a connection with the GPU 635 to the data bus 660, or each additional GPU 655 can be located on another circuit board separately coupled with the data bus 660. Each additional GPU 655 can also be integrated into the same module or chip package as the GPU 635. Each additional GPU 655 can have additional memory, similar to the display memory 640 and additional memory 645, or can share the memories 640 and 645 with the GPU 635.

Further, graphics system 630 may include a DSTA load module 670 and a DSTA unload module 675 that are configured to implement flexible bandwidth ratios for test pattern reuse of a corresponding logic block. For example, the graphics system 630 may be integrated into the logic block, in one embodiment.

Thus, according to embodiments of the present disclosure, systems and methods are described providing for dynamically configuring DSTA modules to implement flexible bandwidth ratios for test pattern reuse of a corresponding logic block.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples in that many architectural variants can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the present disclosure are thus described. While the present disclosure has been described in particular embodiments, it should be appreciated that the disclosure should not be construed as limited by such embodiments, but rather construed according to the below claims.

In one embodiment, operations within a component of system 200 can be coordinated with various other components and features of system 200, external interfaces and components within a test partition. In one embodiment, a UFI and test clock generation is coordinated with DSTA serialization and deserialization operations.

Additional information regarding a Ultra Fast Interface (UFI) is set forth in related co-pending application Ser. No. 15/336,716, entitled Granular Dynamic Test Systems and Methods filed on Oct. 27,2016, which is incorporated herein by reference.

Additional information regarding DSTA is set forth in related co-pending application Ser. No. 15/336,736, entitled Dynamic Scan Test Access (DSTA) filed on Oct. 27, 2016, which is incorporated herein by reference, Additional information regarding coordination of external pad configuration is set forth in related co ending application Ser. No. 15/336,687, entitled Test Partition External Input/Output Interface Control filed on Oct. 27,2016, which is incorporated herein by reference.

Additional information regarding on-line test operations and JTAG test operations is set forth in related co-pending Application Number 15/336,747, entitled Scan System Interface (SSI) filed on Oct. 27, 2016, which is incorporated herein by reference.

Additional information regarding free running clock and independent test partition clock coordination is set forth in related co-pending application Ser. No. 15/336,626, entitled Dynamic Independent Test Partition Clocks filed on Oct. 27, 2016, which is incorporated herein by reference.

Additional information regarding test partition clock staggering and peak power reduction is set forth in related co-pending application Ser. No. 15/336,676, entitled Independent Test Partition Clock Coordination Across Multiple Test Partitions filed on Oct. 27, 2016, which is incorporated herein by reference.

What is claimed:

1. A method for testing, comprising:
    configuring a first set of a first plurality of serial scan input (SSI) connections of a Dynamic Standard Test Access (DSTA) module to receive scan test data, wherein said plurality of (SSI) connections are coupled to a first fixed set of input pins of a first chip including said DSTA module;
    dividing a first external clock frequency down using a first bandwidth ratio to generate a first internal clock frequency, wherein said first bandwidth ratio defines said first external clock frequency and said first internal clock frequency;
    receiving, at said DSTA module, a first set of channels of said scan test data clocked at said first external clock frequency on said set of SSI connections, wherein each channel of said first set of channels of said scan test data is received on a corresponding SSI connection of said first set of SSI connections;
    deserializing, by said DSTA module, said first set of channels of said scan test data clocked at said first external clock frequency to a second set of channels of said scan test data clocked at said first internal clock frequency; and
    scanning, out from said DSTA module, said second set of channels of said scan test data clocked at said first internal clock frequency over a first plurality of pseudo scan input (PSI) connections coupled to scan chains of a logic block, wherein each channel of said second set of channels of said scan test data is output to a corresponding PSI connection, and wherein said first bandwidth ratio defines said first set of SSI connections and said first set of PSI connections.

2. The method of claim 1, wherein said scanning said scan test data comprises:
    collecting said scan test data over a first number of external clock cycles, wherein said first bandwidth ratio also defines said first number of external clock cycles at said first external clock frequency and a first number of internal clock cycles at said first internal clock frequency; and
    scanning said scan test data over said first plurality of PSI connections over said first number of internal clock cycles.

3. The method of claim 2, wherein said first number of internal clock cycles is one.

4. The method of claim 1, wherein said scanning out said scan test data comprises:
    for each SSI connection, collecting a corresponding first subset of scan test data over a first number of external clock cycles, wherein said first bandwidth ratio also defines said first number of external clock cycles at said first external clock frequency and a first number of internal clock cycles at said first internal clock frequency; and
    scanning said corresponding first subset of scan test data over a corresponding first number of PSI connections over said first number of internal clock cycles at said internal clock frequency, wherein said first bandwidth ratio defines said first number of PSI connections.

5. The method of claim 1, further comprising:
    configuring said DST A module for said logic block that is integrated within a second chip to a second bandwidth ratio, wherein said second bandwidth ratio defines a second plurality of SSI connections and a second plurality of PSI connections, wherein said second plurality of SSI connections is configured for receiving said scan test data clocked at a second external clock frequency, and wherein said second plurality of PSI connections is configured for inputting said scan test data to said plurality of scan chains according to said second bandwidth ratio, wherein said second bandwidth ratio also defines said second external clock frequency and said second internal clock frequency.

6. The method of claim 5, wherein said first plurality of PSI connections is identical to said second plurality of PSI connections.

7. The method of claim 1, further comprising:
adjusting said first external clock frequency to match said first bandwidth ratio, wherein said internal clock frequency is fixed.

8. The method, of claim 1, further comprising:
adjusting said internal clock frequency to match said first bandwidth ratio, wherein said external clock frequency is fixed.

9. The method of claim 1, further comprising:
receiving, at said DSTA module, output scan data from said plurality of scan chains over a first plurality of pseudo scan output (PSO) connections and clocked at said internal clock frequency; and
scanning, out from said DSTA module, said output scan data over a plurality of serial scan output (SSO) connections clocked at said first external clock frequency.

10. The method of claim 9, wherein said first plurality of SSI connections comprises at least one of said first plurality of SSO connections.

11. The method of claim 9, further comprising:
wherein in said receiving output scan data, said first bandwidth ratio also defines said first plurality of PSO connections and a first plurality of serial scan output (SSO) connections; and
wherein in said scanning out said output scan data, said output scan data is scanned according to said first bandwidth ratio, such that said output scan data is collected from said first plurality of PSO connections over said first number of internal clock cycles at said first internal clock frequency, and scanned out over, said first plurality of SSO connections over said first number of external clock cycles at said first external clock frequency.

12. The method of claim 1, further comprising:
broadcasting said scan test data over a super plurality of SSI connections clocked at said first external clock frequency, wherein said super plurality of SSI connections comprises said first plurality of SSI connections for testing said first logic block and another plurality of SSI connections configured for testing another logic block similarly as said first logic block.

13. A computer system comprising:
a processor; and
memory coupled to said processor and having stored therein instructions that, if executed by said computer system, cause said computer system to execute a method for testing comprising:
generating a first external clock frequency;
configuring a first set of a first plurality of serial scan input (SSI) connections of a Dynamic Standard Test Access (DSTA) module to receive scan test data, wherein said plurality of (SSI) connections are coupled to a first fixed set of input pins of a first chip including said DSTA module;
dividing said first external clock frequency down using a first bandwidth ratio to generate a first internal clock frequency, wherein said first bandwidth ratio defines said first external clock frequency and said first internal clock frequency;
receiving, at said DSTA module, a first set of channels of said scan test data clocked at said first external clock frequency on said set of SSI connections, wherein each channel of said first set of channels of said scan test data is received on a corresponding SSI connection of said first set of SSI connections;
deserializing, by said DSTA module, said first set of channels of said scan test data clocked at said first external clock frequency to a second set of channels of said scan test data clocked at said first internal clock frequency; and
scanning, out from said DSTA module, said second set of channels of said scan test data clocked at said first internal clock frequency over a first plurality of pseudo scan input (PSI) connections coupled to scan chains of a logic block, wherein each channel of said second set of channels of said scan test data is output to a corresponding PSI connection, and wherein said first bandwidth ratio defines said first set of SSI connections and said first set of PSI connections.

14. The computer system of claim 13, wherein said scanning said scan test data in said method further comprises:
collecting said scan test data over a first number of external clock cycles, wherein said first bandwidth ratio also defines said first number of external clock cycles at said first external clock frequency and a first number of internal clock cycles at said first internal clock frequency; and
scanning said scan test data over said first plurality of PSI connections over said first number of internal clock cycles.

15. The computer system of claim 13, wherein said method further comprises:
configuring said DSTA module for said logic block integrated within a second chip to a second bandwidth ratio, wherein said second bandwidth ratio defines a second plurality of SSI connections and a second plurality of PSI connections of said second chip, wherein said second plurality of SSI connections is configured for receiving said scan test data clocked at a second external clock frequency, and wherein said second plurality of PSI connections is configured for inputting said scan test data to said plurality of scan chains according to said second bandwidth ratio, wherein said second bandwidth ratio also defines said second external clock frequency and said second internal clock frequency.

16. The computer system of claim 13, wherein said method further comprises:
receiving, at said DSTA module, output scan data from said plurality of scan chains over a first plurality of pseudo scan output (PSO) connections and clocked at said internal clock frequency; and
scanning, out from said DSTA module, said output scan data over a plurality of serial scan output (SSI) connections clocked at said first external clock frequency.

17. An apparatus for testing comprising:
an external clock for generating a first external clock frequency;
a clock divider configured for dividing said first external clock frequency down using said first bandwidth ratio to generate a first internal clock frequency, wherein said first bandwidth ratio also defines said first external clock frequency and said first internal clock frequency;
a first chip including a logic block, a first plurality of serial scan input (SSI) connections, a first instance of a Dynamic Standard Test Access (DSTA) module, and a first plurality of pseudo scan input (PSI) connections, wherein;

said first instance of said DSTA module is configured to receive a first set of channels of scan test data clocked at said first external clock frequency on a first set of said SSI connections, wherein said test data is designed for testing said logic block when input to a plurality of scan chains of said logic block;

said first instance of said DSTA module is further configured to deserialize said first set of channels of said scan test data clocked at said first external clock frequency to a second set of channels of said scan test data clocked at said first internal clock frequency according to said first bandwidth ratio; and said first instance of said DSTA module is further configured to scan out said second set of channels of said scan test data clocked at said first internal clock frequency over a first plurality of pseudo scan input (PSI) connections coupled to scan chains of a logic block, wherein each channel of said second set of channels of said scan test data is output to a corresponding PSI connection, and wherein said first bandwidth ratio defines said first set of SSI connections and said first set of PSI connections.

18. The apparatus of claim 17, wherein said first instance of said DSTA module configured to deserialize includes:

collecting said scan test data over a first number of external clock cycles, wherein said first bandwidth ratio also defines said first number of external clock cycles at said first external clock frequency and a first number of internal clock cycles at said first internal clock frequency; and scanning said scan test data over said first plurality of PSI connections over said first number of internal clock cycles.

19. The apparatus of claim 17, further comprising:

a second chip including said logic block, said first plurality of SSI connections, a second instance of said DSTA module, and said first plurality of PSI connections, wherein;

said second instance of said DSTA module is configured to receive a second set of channels of said scan test data clocked at a second external clock frequency on a second set of said SSI connections;

said second instance of said DSTA module is further configured to deserialize said second set of channels of said scan test data clock at said second external clock frequency to said second set of channels of said scan test data clocked at said first internal clock frequency according to a second bandwidth ratio; and said second instance of said DSTA module is further configured to scan out said second set of channels of said scan test data clocked at said first internal clock frequency over a first plurality of pseudo scan input (PSI) connections coupled to scan chains of a logic block, wherein said second bandwidth ratio defines said second set of SSI connections and said first set of PSI connection.

20. The apparatus of claim 17, further comprising:

said first instance of said DSTA module further configured to received a first set of channels of output data clocked at said first internal clock frequency on a first set of pseudo scan output (PSO)) connections from said scan chains of said logic block;

said first instance of said DSTA module further configured to serialize said first set of channels of said output data clocked at said first internal clock frequency to a second set of channels of said output data clocked at said first external clock frequency according to said second bandwidth ratio; and said first instance of said DSTA module further configured to scan out said second set of channels of said clocked at said first external clock over a first plurality of serial scan output (SSO) connections, wherein said first bandwidth ratio further defines said first set of PSO connections and said first set of SSO connections.

* * * * *